(12) United States Patent
Kurotsuchi et al.

(10) Patent No.: US 7,443,721 B2
(45) Date of Patent: Oct. 28, 2008

(54) SEMICONDUCTOR INTEGRATED DEVICE

(75) Inventors: Kenzo Kurotsuchi, Kokubunji (JP);
Kiyoo Itoh, Higashikurume (JP);
Norikatsu Takaura, Tokyo (JP);
Kenichi Osada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 292 days.

(21) Appl. No.: 11/341,385

(22) Filed: Jan. 30, 2006

(65) Prior Publication Data
US 2006/0203542 A1    Sep. 14, 2006

(30) Foreign Application Priority Data

Feb. 10, 2005  (JP)  ............................. 2005-034155
Apr. 14, 2005  (JP)  ............................. 2005-116612

(51) Int. Cl.
*G11C 11/00* (2006.01)
(52) U.S. Cl. ...................... 365/163; 365/148; 365/100; 257/2; 438/96
(58) Field of Classification Search ................ 365/163, 365/148, 100; 438/96; 257/2
See application file for complete search history.

(56) References Cited

U.S. PATENT DOCUMENTS

| 3,886,577 | A | 5/1975 | Buckley |
| 5,883,827 | A | 3/1999 | Morgan |
| 6,576,921 | B2 | 6/2003 | Lowrey |
| 6,590,807 | B2 | 7/2003 | Lowrey |
| 6,636,433 | B2 * | 10/2003 | Tanikawa ..................... 365/36 |
| 7,106,618 | B2 * | 9/2006 | Morimoto ................... 365/148 |
| 7,184,297 | B2 * | 2/2007 | Yasuda et al. ............... 365/148 |
| 2004/0165422 | A1 * | 8/2004 | Hideki et al. ............... 365/163 |
| 2005/0002227 | A1 * | 1/2005 | Hideki et al. ............... 365/163 |
| 2006/0098473 | A1 * | 5/2006 | Yasuda ....................... 365/148 |
| 2006/0285380 | A1 * | 12/2006 | Cho et al. .................... 365/148 |
| 2007/0159867 | A1 * | 7/2007 | Muraoka et al. ............. 365/100 |
| 2008/0025072 | A1 * | 1/2008 | Tamai et al. ................ 365/148 |

FOREIGN PATENT DOCUMENTS

JP    50-65177    9/1974

OTHER PUBLICATIONS

Y. Hwang et al., "Full Integration and Reliability Evaluation of Phase-change RAM Based on 0.24 μm-CMOS Technologies," 2003 Symposium on VLSI Technology Digest of Technical Papers, 2003, pp. 173-174.
M. Gill et al., "Ovonic Unified Memory—A High-Performance Non-volatile Memory Technology for Stand-Alone Memory and Embedded Applications," 2002 IEEE International Solid-State Circuits Conference, ISSCC 2002, Session 12, TD: Digital Directions, 12.4, Feb. 5, 2002 (3 Pages).

* cited by examiner

*Primary Examiner*—Richard Elms
*Assistant Examiner*—Eric Wendler
(74) *Attorney, Agent, or Firm*—Miles & Stockbridge P.C.

(57) ABSTRACT

A semiconductor non volatile memory device capable of multiple write operations with high reliability includes memory cells. Each memory cell of the device has a first electrode, a second electrode, and an information storage section between the two electrodes. A segregation of composing elements of the information storage section caused by applying a first current pulse from the first electrode to the second electrode is corrected by applying a second current pulse from the second electrode to the first electrode such that the composition of the storage section recovers to its original state.

22 Claims, 19 Drawing Sheets

AFTER WRITING 0 ONCE

AFTER WRITING 0 MULTIPLE TIMES

SEMICONDUCTOR INTEGRATED DEVICE

CLAIM OF PRIORITY

The present application claims from Japanese application JP 2005-034155 filed on Feb. 10, 2005, and Japanese application JP 2005-116612 filed on Apr. 14, 2005, the contents of which are hereby incorporated by reference into this application.

FIELD OF THE INVENTION

The present invention relates to semiconductor integrated circuit devices, and more particularly to an effective technique applicable to the semiconductor integrated circuit devices having discriminator memory cells for stored information utilizing resistance differences, for example, high density integrated memory circuits including the memory cells of phase change materials, logic mix mounted memories wherein a memory circuit and a logic circuit are arranged on the same semiconductor substrate, or analog circuits. Furthermore, the present invention relates in particular to random access memories able to operate under a low voltage, with a high speed, and non-volatile property.

BACKGROUND OF THE INVENTION

The non-volatile memory market is expanding appreciably pulled by the demand for mobile apparatus, typically, cellphones. A flush memory is one of the representative non-volatile memories, and used as a PROM since its operation speed is slow. However, a high speed RAM is required as a scratch pad memory, therefore, FLASH and DRAM memories are both mounted on the mobile devices. If a device is implemented including the aspects of these two memories, the expected impact will be extremely large not only because a FLASH and a DRAM are integrated into a single chip unit, but also because the device will be able to replace all the semiconductor memories.

One of the candidates to implement the device is a non-volatile memory with phase change films, for example, disclosed in detail in U.S. Pat. No. 5,883,827. The phase change memory is sometimes called a PRAM, an OUM, or an Ovonyx memory. For this memory, storage information to be stored is written into the element with the change of the crystalline state of the element in response to the heat generated by the current through the element. Chalcogenide is used as a material for the memory element. The chalcogenide is a material to include at least one element from sulfur, selenium, and tellurium. The chemical composition of chalcogenide sometimes used is, for example, $Ge_2Sb_2Te_5$.

Next, an operational principle of the phase change memory is explained briefly. In the case to cause an amorphization to a portion of chalcogenide wherein a phase is changed, the portion is heated to just above its melting point, and an electric reset pulse is applied thereto for cooling rapidly. The melting point is 600° C., for example, and the time required for the cooling is 10 nsec, for example. In the case of crystallization of the phase change portion, the temperature of the phase change portion is maintained above its crystallization and below melting point. The temperature required for this process, for example, is 400° C. The time required for crystallization depends on the composition of chalcogenide material, and 200 nsec, for example. Thereafter, the crystallization of phase change portion of the phase change memory cells is called a set operation, and its amorphization is called a reset operation.

An aspect of the phase change memory is that the resistivity of the phase change portion changes by 2 to 3 orders of magnitude depending on crystalline or non-crystalline state. Since the resistivity being high or low is read by corresponding to '0' or '1', larger the difference in resistivity, easier the sense operation to read, resulting in fast read. Furthermore, by applying the resistivity to ternary or even larger system, storage of multiple values also becomes possible.

The write procedure to the phase change memory in described in U.S. Pat. No. 5,883,827. And the following fact is also described in JP-A No. 65177/1975, that with the write operation a deviation in the storage material composition is caused by the drift of electrically positive elements toward the negative electrode, whereas, in contrast, negative elements toward the positive electrode. The references on the direction of the electric current pulse through the phase change element areas follows; A concept is described in U.S. Pat. No. 6,576,921, that a current flows from the upper electrode to the plug electrode in the phase change memory for information storage element with the structure that the phase change material is sandwiched between the upper electrode and the plug electrode. And another concept is described in 2003 symposium on VLST Technology pp. 173-174, digest of technical papers, that a current flows from the plug electrode to the upper electrode.

SUMMARY OF THE INVENTION

The structure and composition of the information storage section, a write operation is not yet executed thereto, is shown in FIG. 2, wherein the composition of chalcogenide 102 is homogeneous. The composition of chalcogenide is selected to be $Ge_2Sb_2Te_5$ as an example, and explained bellow.

A wave form in the write operation of the prior art is shown in FIG. 3. The current flows only to one direction for set and reset operations. The composition of chalcogenide is kept to be almost uniform when the write operation is executed about once. At a reset operation, the area around the electrode 154 becomes high in temperature, the write current concentrates thereto, and is amorphized as shown in FIG. 4A. At this time, since the length 121 of amorphous phase 111 with a high resistivity, that the resistance between the electrode 103 and the electrode 154 becomes high.

However, if a large number of write operation of $10^5$ to $10^{12}$ is executed, a portion around the plug electrode 154 changes to a crystalline phase. The reason for this will be described later. Since the length 144 of amorphous phase 141 becomes short, the resistance between the electrode 103 and the electrode 154 decreases.

On the other hand, the resistance in the set state does not change so much. Therefore, a discrimination of storage information between '0' an '1' becomes difficult.

In the reset state, the reason why the portion around the plug electrode changes to a crystalline phase is the following: a phase change memory, chalcogenide, is rewritten by heating it with Joule heat, therefore, an electric field is applied to the chalcogenide when its temperature is high in order to write information to it, that causes ion conduction due to the difference in electron negativity between the elements comprising the chalcogenide. Thus, the segregation of composing elements is produced.

In the case of $Ge_2Sb_2Te_5$, since Ge (Pauling electronegativity 1.8) and Sb (electronegativity 1.9) both have lower electronegativities than Te (electron negativity 2.1) and relatively positive elements, both elements drift to the current direction. In contrast to this, since Te is a negative element, it drifts to the opposite direction.

Accordingly, as shown in FIG. 5 in the case wherein a current flows from the electrode 103 to the electrode 154, the composition ratio of Te in the chalcogenide 132 around the electrode 103 increases, whereas the composition ratios of Ge, and Sb increase around the electrode 154.

A speed for crystallization depends on the composition of chalcogenide. Due to the segregation of the composing element, a portion where crystallization speed is high is not amorphized and becomes in a crystalline state when a reset pulse is applied. Thus, a crystalline phase 143 is formed around the plug electrode 154 in the reset state as shown in FIG. 4B.

The summary of the typical embodiments disclosed in the present invention is described as follows:

A system including a memory cell having an information storage section sandwiched between the first electrode and the second electrode, the system is characterized in that the system executes the operations as one set comprising of; an operation to feed a current from the first electrode to the second electrode, and an operation to feed a current from the second electrode to the first electrode, the direction opposite to the first, and the two operations are preferably executed as a pair. Although a composition segregation is produced in the memory cell by the first pulse, the segregation is resolved by the application of the second pulse and the memory cell composition is recovered to the original state.

The information storage section preferably comprises a variable resistor.

The variable resistor is preferably a phase change element wherein its resistance value changes depending on its crystalline state.

Preferably, a material of a phase change element comprises a chalchogenide.

A highly reliable semiconductor non-volatile memory device is implemented for multiple write operations with the semiconductor integrated circuit device of the present invention. This device is also capable to provide highly reliable, highly functional personal computers by mix mounting of an arithmetic logic unit with the device on the same substrate. The device is also provided as a single unit.

DETAILED DESCRIPTION OF THE PREFERRED EMBODIMENTS

The invention will be described and explained in detail with reference to the accompanying embodiments.

First Embodiment

FIG. 1 and FIGS. 6 to 10 show the semiconductor memory cells and their operational wave forms of the first embodiment of the present invention.

Figure 1A:
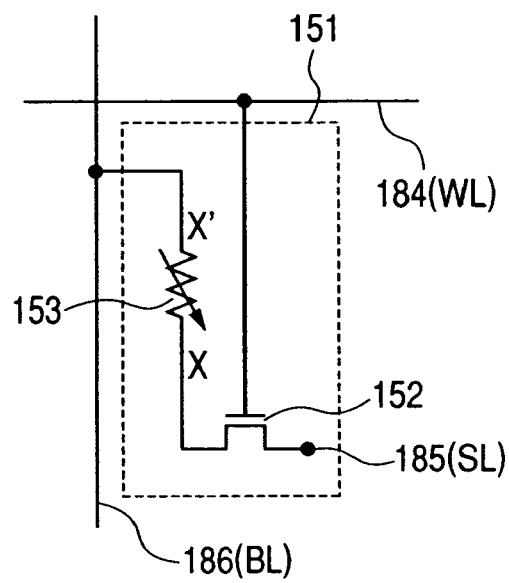
FIG. 1A is a schematic circuit diagram of a memory cell of first embodiment in accordance with the present invention.
Figure 1B:
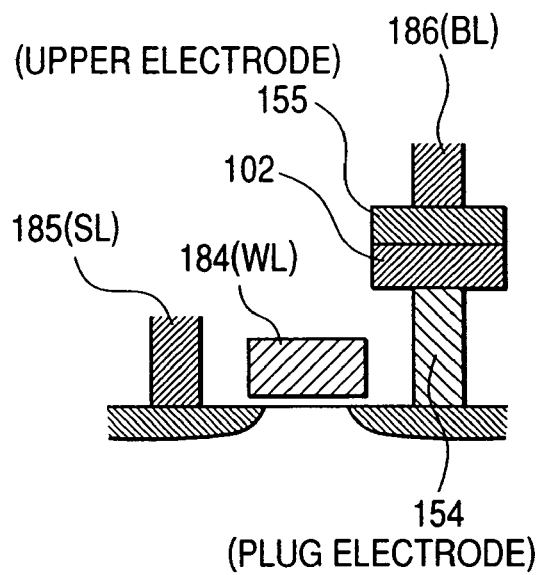
FIG. 1B is a schematic cross sectional view of a memory cell of first embodiment in accordance with the present invention.

FIG. 1A shows a memory cell 151 comprising a select element 152 and an information storage section 153. The information storage section 153 has a structure connected to a MOS transistor, i.e., a select element 152, and a source line 185. Of course, another structure is possible, wherein the information storage element is connected to a select element 152 and a bit line 186. In such cases, a current flows from either the bit line 186 or the source line185 by applying a voltage pulse to the word line 184, to make the select element conductive. FIG. 1B shows a schematic diagram of the memory cell cross-section. The structure of the information storage section 153 is such that a chalcogenide 102 is sandwiched between an upper electrode 155 having a comparatively large contact area with the chalcogenide and a plug electrode 154 having a smaller contact area with the chalcogenide than the above upper electrode 155.

Figure 1C:
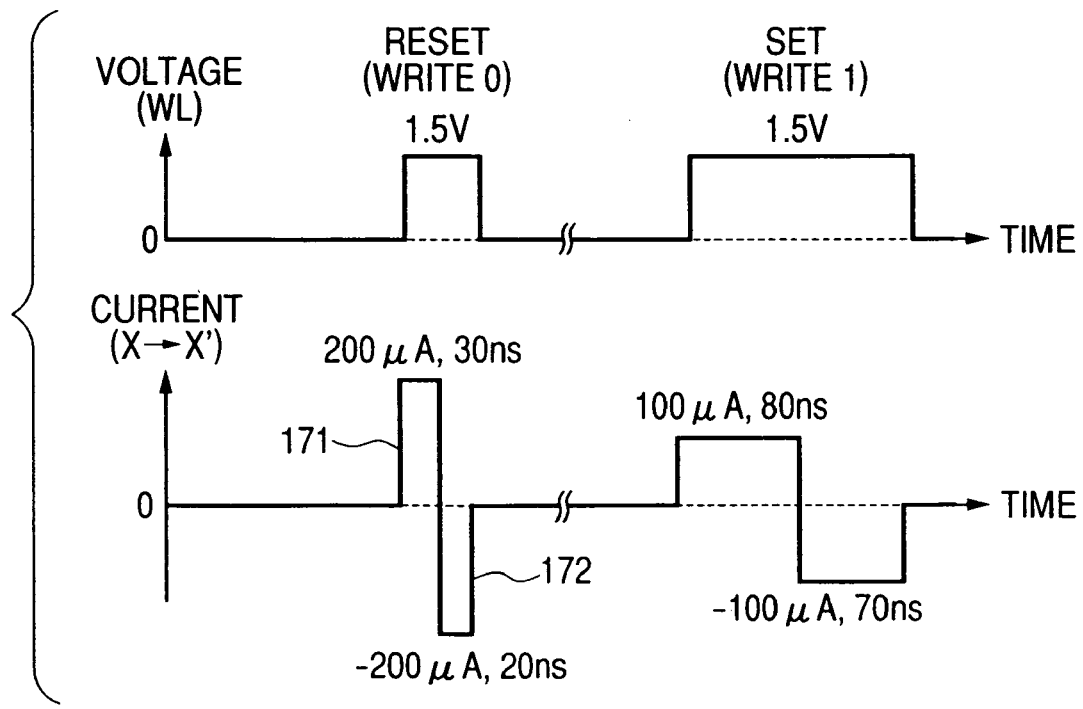
FIG. 1C shows a voltage and a current wave forms in the circuit of a memory cell first embodiment in accordance with the present invention.
Figure 2:
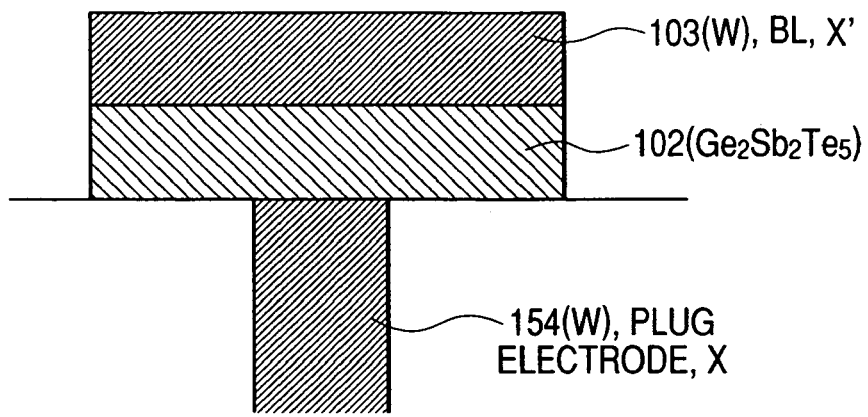
FIG. 2 is a schematic cross sectional view of a phase change memory to show its construction and composition.
Figure 3:
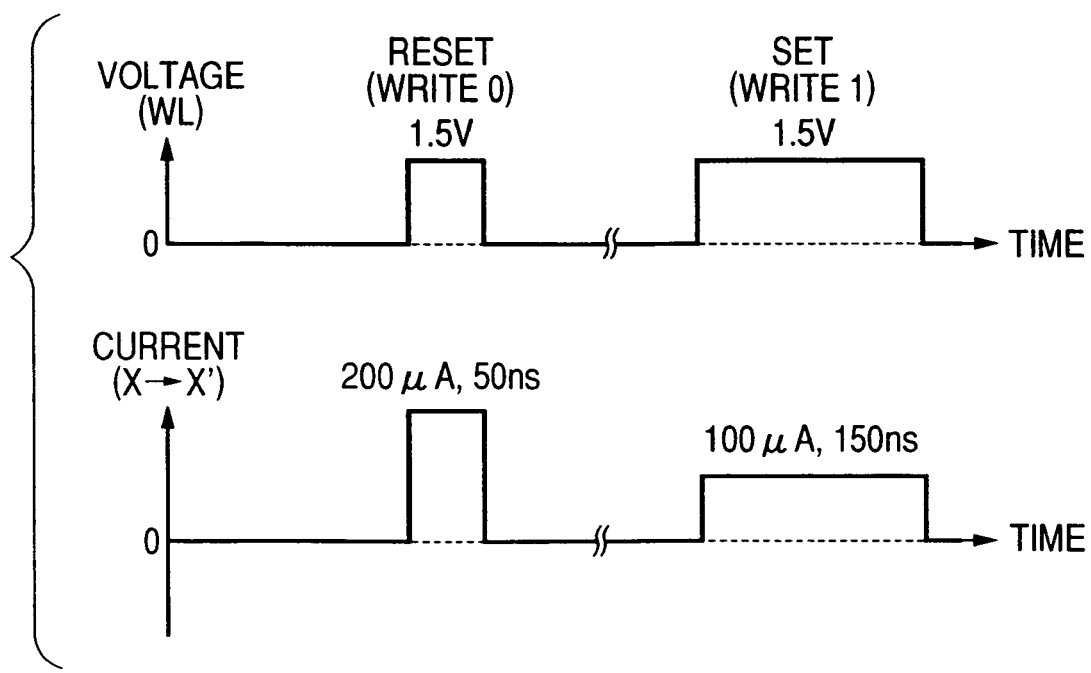
FIG. 3 shows a voltage and a current wave forms in the circuit of a memory cell of the prior art.
Figure 4A:
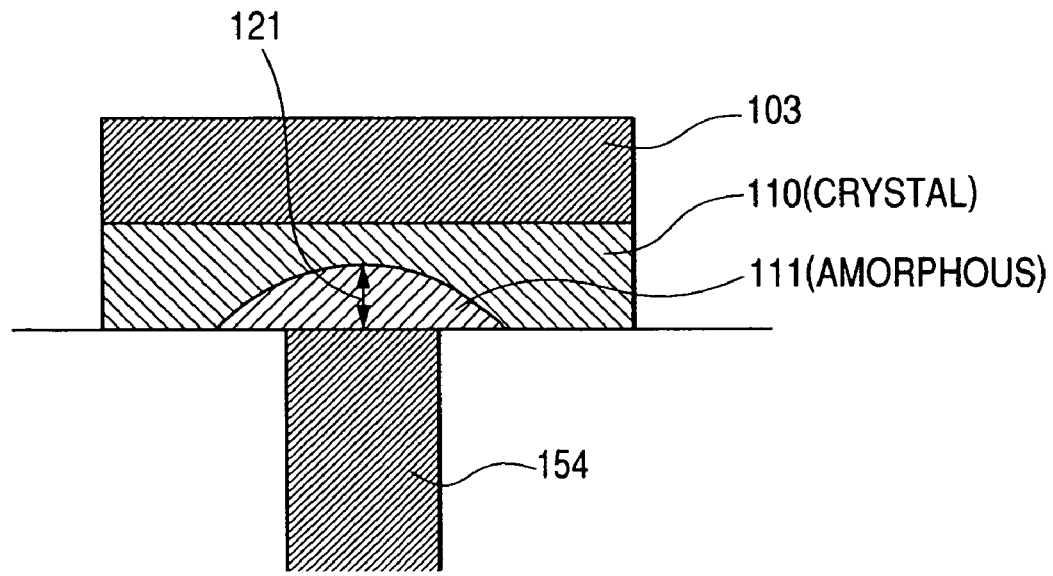
FIG. 4A is a schematic cross sectional view of a phase change memory of the prior art to show its construction after a write operation.
Figure 4B:
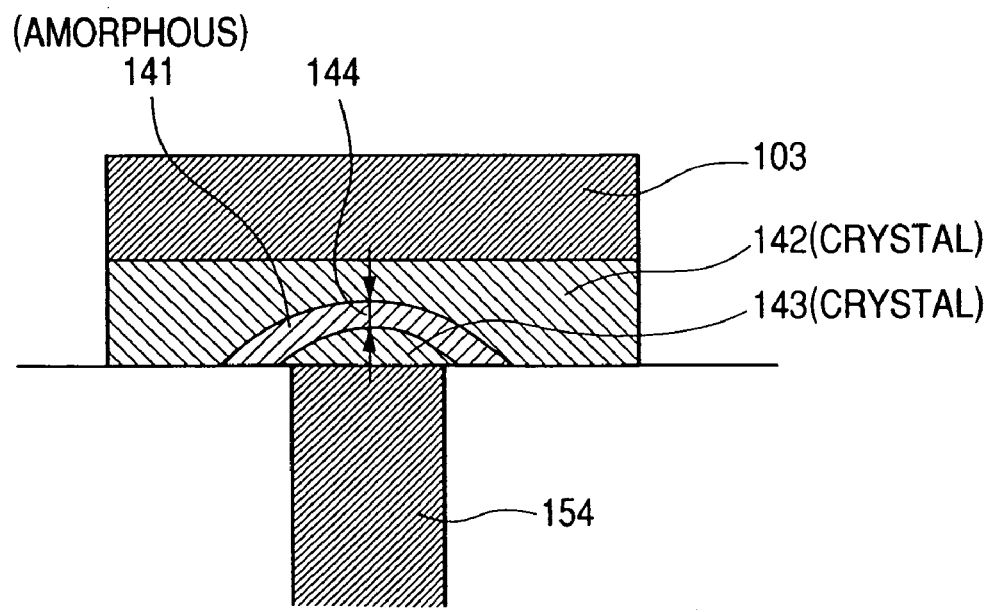
FIG. 4B is a schematic cross sectional view of a phase change memory of the prior art to show its construction after multiple write operations.
Figure 5:
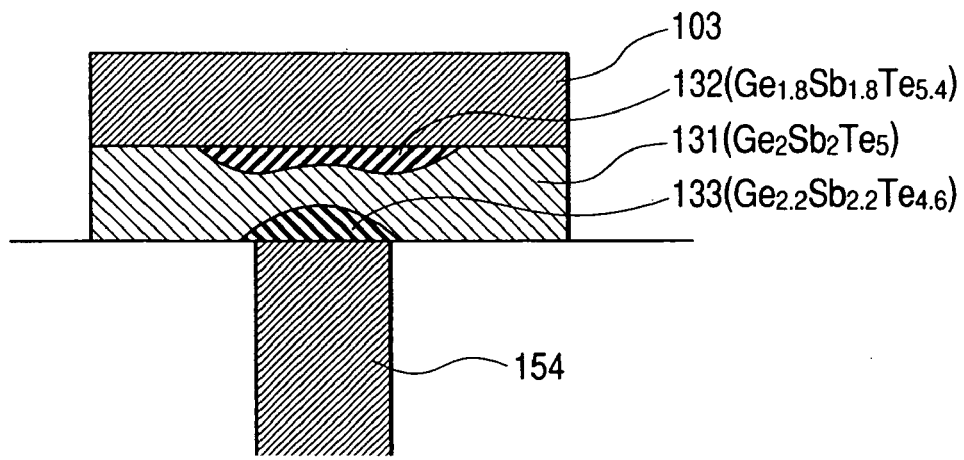
FIG. 5 is a schematic cross sectional view of a phase change memory of the prior art to show its composition.

Then the current polarity always switched to the opposite one at the operation as shown in FIG. 1C, enabling to prevent the chalcogenide from the segregation of the composing elements due to conductive ions and results in the effect of increasing the number of possible write times. The amplitude and the width of a pulse current with a positive or a negative polarity at a reset or a set operation can be arbitrary selected within a similar thermal effect for those of the prior art shown in FIG. 3.

For example, in the case where a reset pulse is applied to a device, and switching the current to the opposite direction, the first pulse 171 has a width of 30 ns and a current amplitude of 200 μA. The second pulse 172 has a width of 20 ns and a current amplitude of 200 μA. Corresponding to the compositions of the chalcogenide and the electrode to be used, the most suitable values must be obviously selected for the pulse width and the amplitude. The total amount of joule heat produced by the first pulse current and the second pulse current is nearly equal to the heat produced by a reset pulse of the prior art.

In the case where a reset pulse is applied to a device, and switching the current to the opposite direction, the first pulse 171 has a width of 80 ns and a current amplitude of 100 μA. The second pulse 172 has a width of 70 ns and a current amplitude of 100 μA.

And if necessary, switching the current to the opposite direction can be executed only when a reset pulse is applied to a device. The highest attainable temperature of the chalcogenide at the reset operation is higher than at the set operation, since the composition segregation of the chalcogenide occurs mainly at the reset operation. Besides, it is assumed that during the time when the current pulse 171 or 172 flows, a word pulse voltage is applied to the word line 184. The positive or the negative current is obtained by causing the electric current to flow either from the bit line (BL) 186 to the source line (SL) 185 or from the source line (SL) 185 to the bit line (BL) 186 as shown in FIG. 1A. The above described word pulse voltage may be a single one including two currents 171 and 172, or separated to two each including the corresponding one as shown in FIG. 1C.

The pulse current wave forms for the set and reset operations are illustrated in FIGS. 6 to 10.

Figure 6:
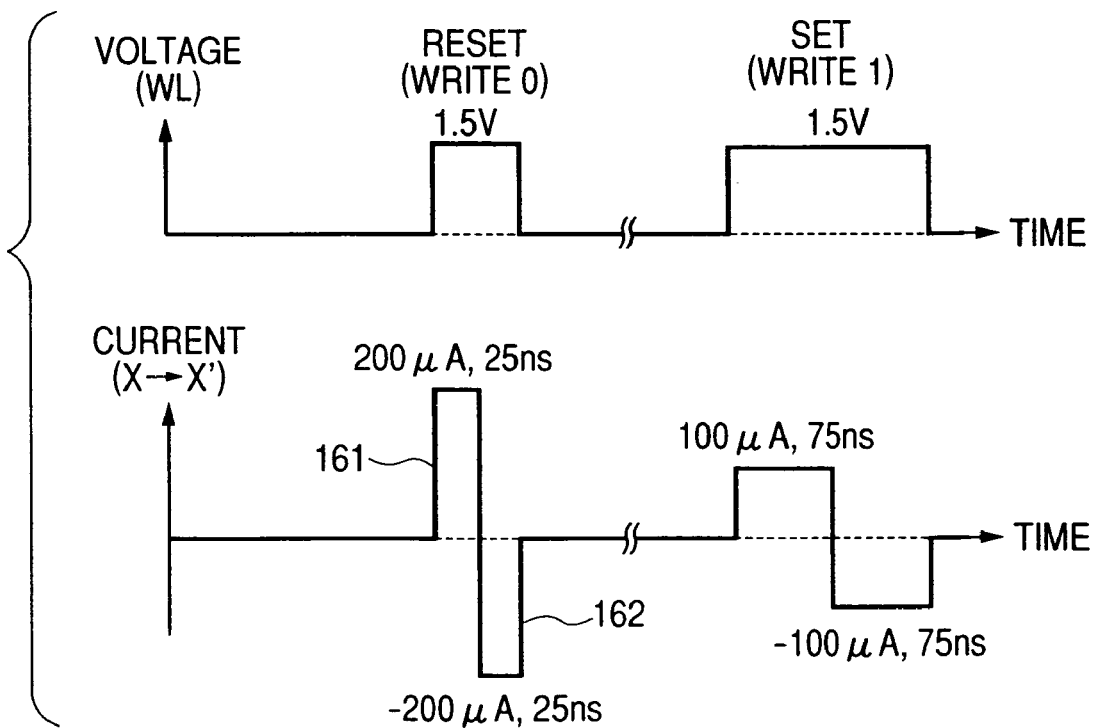
FIG. 6 shows a voltage and a current wave forms in the circuit of a memory cell of first embodiment in accordance with the present invention.

FIG. 6 is characterized in that the amplitude and the time duration are about the same of the first pulse current 161 and the second pulse current 162. Since in this case, an electric charge flowing through the chalcogenide by the first pulse current is approximately the same as the electric charge by the second pulse current, it is possible to suppress the composition deviation. In this system, a current can be generated in both directions by causing the current flow either from the bit line or from the source line by switching a pulse current source, that the circuit design around the memory cells becomes simple for producing the write pulse.

Figure 7:
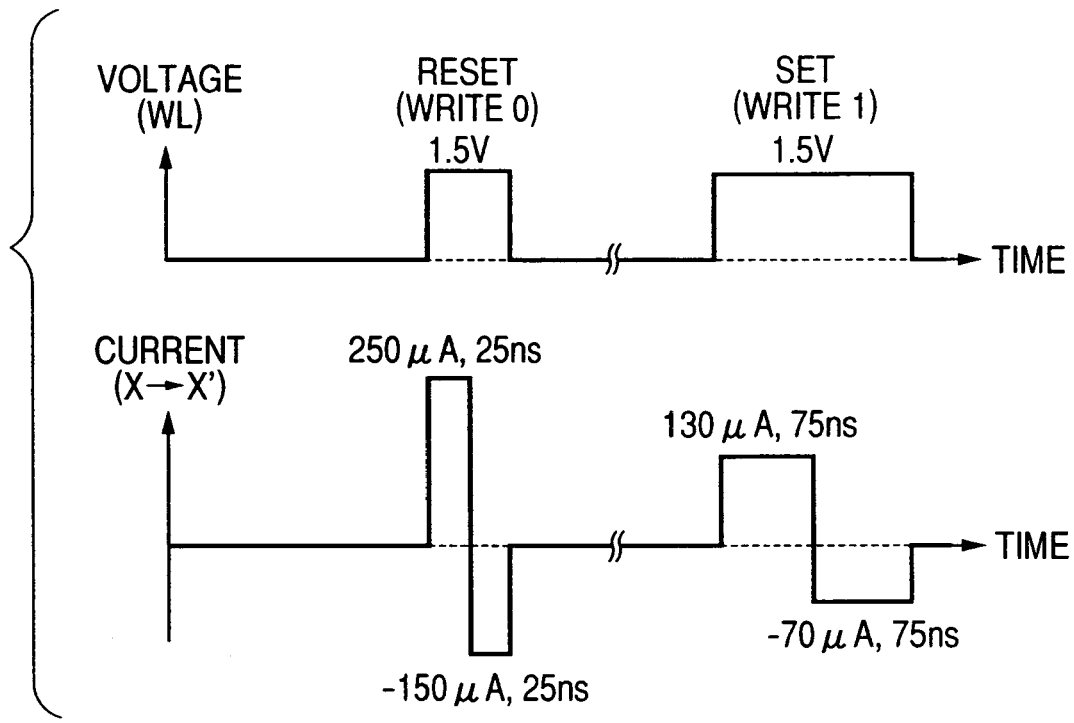
FIG. 7 shows a wave form diagram of another procedure in the circuit of a memory cell of first embodiment in accordance with the present invention.

FIG. 7 is characterized in that the current amplitude of the first pulse is larger than that of the second. The advantages with the above aspect are as follows: If the temperature of the chalcogenide goes up, a binding force between atoms comprising the chalcogenide becomes weaker and the segregation is produced more easily under the same electric field applied thereon. Since the temperature of the chalcogenide is already high, when the first pulse is applied on, and in the case wherein if the amplitude of the second pulse is the same as that of the first, number of atoms drifting due to the second pulse is larger than that of the first, resulting the segregation in the composition of the chalcogenide. In order to solve this problem, the amplitude of the second pulse is to be smaller than that of the first, resulting in that the number of atoms caused to drift by the first pulse becomes equal to the number of atoms caused to drift by the second pulse.

In addition, it is also available that the driving current of selected transistor changes corresponding to the direction of the current. The reason why the driving current changes is explained 1 in reference to FIG. 1A. In the case wherein the electric potential of the bit 186 is higher than that of the source line 185, the voltage difference between the gate and the source of the select transistor 152 is equal to the voltage difference between the word line and the source line 185. And in the case wherein the electric potential of the bit 186 is lower than that of the source line 185, the voltage difference between the gate and the source of the select transistor 152 is equal to the voltage difference between the position X and the word line 184. Here, the potential at the position X is equal to or lower than that of the source line, and equal to or higher than that of the bit line. Therefore, the driving current for the transistor 152 becomes higher when the potential of the bit line 186 is higher than that of the source line 185.

Figure 8:
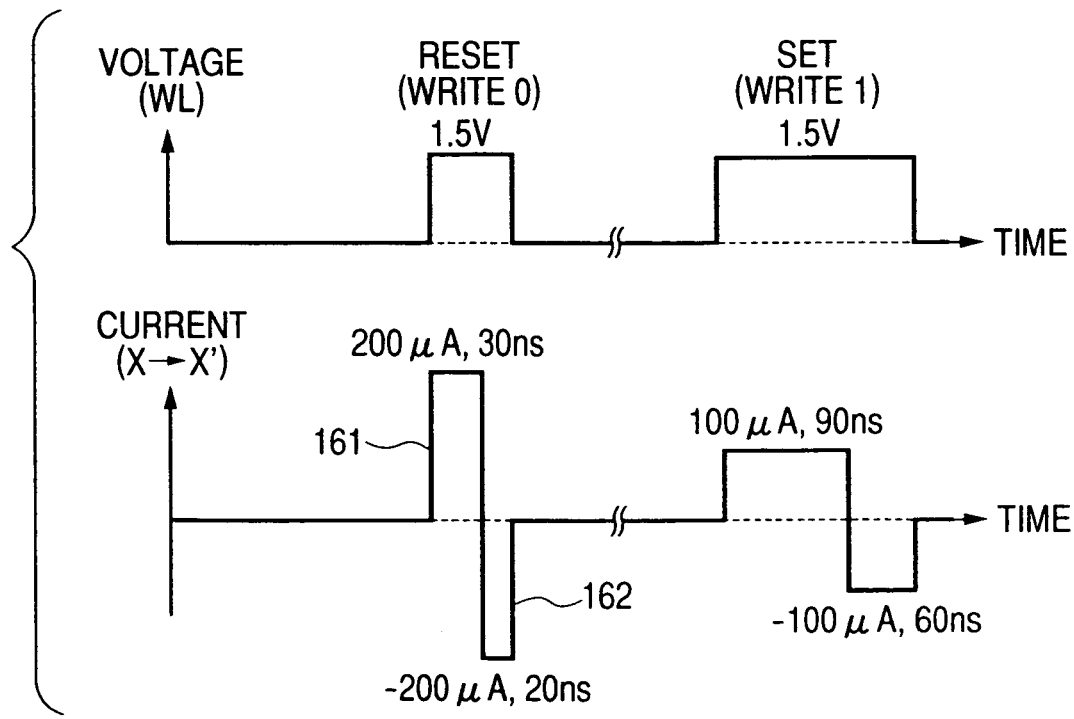
FIG. 8 shows a wave form diagram of another procedure in the circuit of a memory cell of first embodiment in accordance with the present invention.

In contrast to the above, FIG. 8 is characterized in that the time length of the first pulse is longer than that of the second pulse. This is because the same correction is applied as in FIG. 7. In the present system, the peripheral circuit architecture of the memory cells becomes simpler, since the set or the reset operation can be executed by applying a single constant current source at an appropriate timing.

Figure 9:
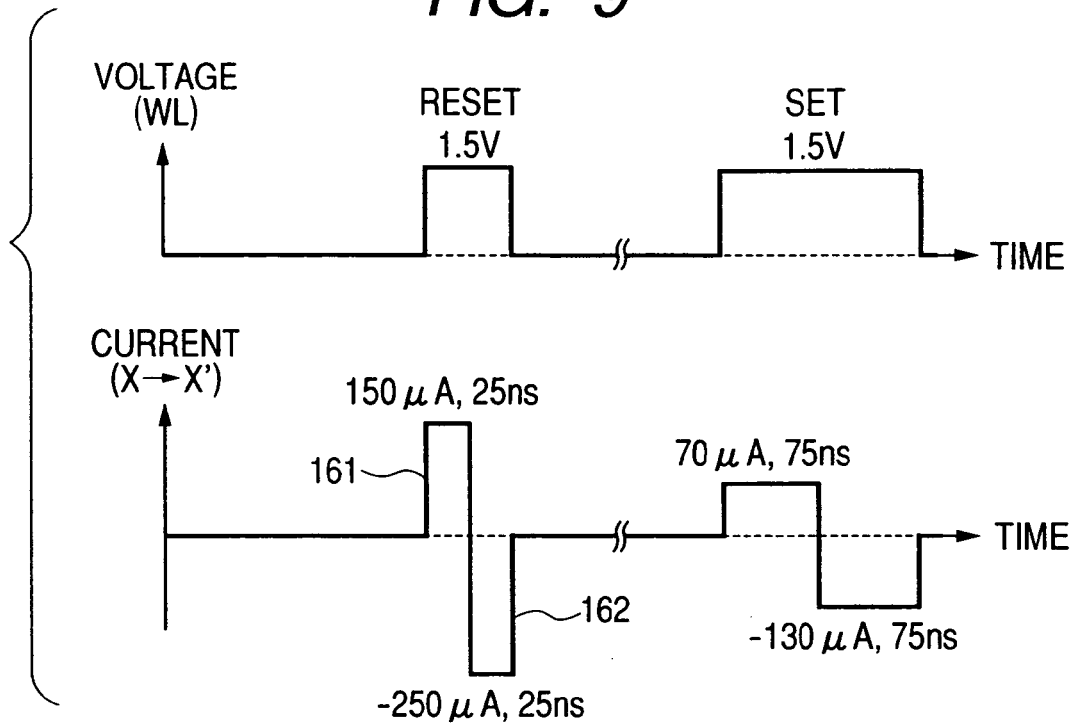
FIG. 9 shows a wave form diagram of another procedure in the circuit of a memory cell of first embodiment in accordance with the present invention.

In contrast to the above, FIG. 9 is characterized in that the current amplitude of the first pulse is smaller than that of the second pulse. The chalcogenide has a property that its resistance decreases if it is heated. Therefore, assuming the current amplitudes of the first pulse and the second are the same, then the applied voltage to the chalcogenide by the first pulse is larger than that of the second pulse, and the number of the drifting atoms due to the first pulse is over those due to the second pulse. Hence, by reducing the amplitude of the first current pulse than that of the second pulse current, the number of drifting atoms become equal to each other.

Figure 10:
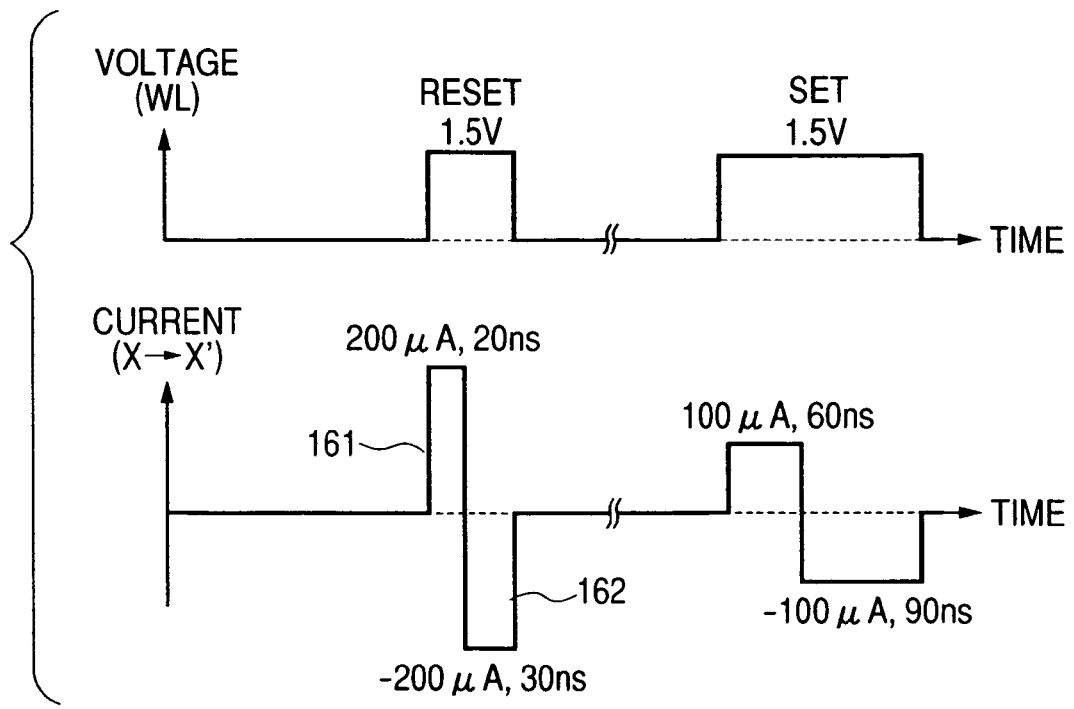
FIG. 10 shows a wave form diagram of another procedure in the circuit of a memory cell of first embodiment in accordance with the present invention.

FIG. 10 shows a similar effect as described above is obtained by increasing the current amplitude of the first pulse than that of the second pulse.

Figure 11:
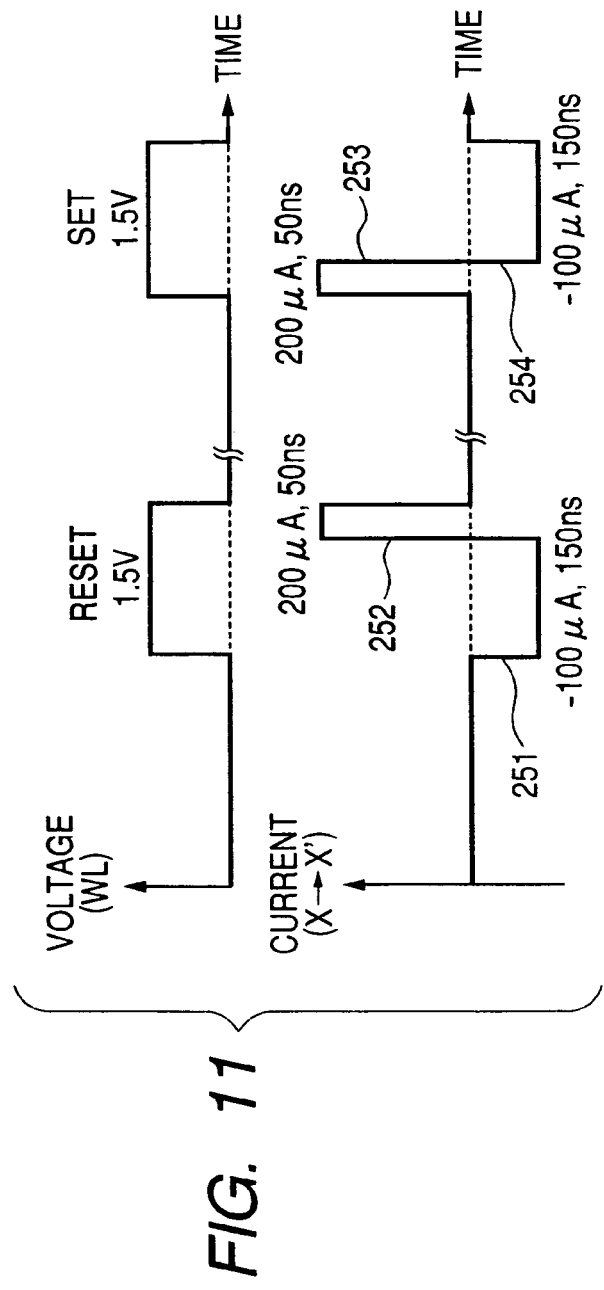
FIG. 11 shows a wave form diagram of another procedure in the circuit of a memory cell of first embodiment in accordance with the present invention.

The FIG. 11 shows an embodiment obtained from the combination of FIGS. 6 to 10. In the reset operation, the first pulse 251 having a relatively small current of 20 to 400 μA and a relatively long width of 50 to 1000 ns is applied, and then the succeeding second pulse 252 having a relatively large current of 50 to 1000 μA and a relatively short width of 5 to 100 ns is applied to flow to the direction opposite to each other. Furthermore, in the set operation, the order of the pulses, the first and the second applied in the reset operation, is reversed and applied. The reset operation is shown in the combination of FIGS. 8 and 9, whereas, the set operation is shown in the combination of FIGS. 7 and 10.

In the reset operation, the chalcogenide is crystallized by the first pulse current 251, whereas the chalcogenide is amorphized by the succeeding second pulse current 252.

In the set operation, the chalcogenide is amorphized by the first pulse current 253, whereas the chalcogenide is crystallized by the succeeding second pulse current 254

The present system has an advantage that the circuit configuration is simple because the set and the reset operations are executed by only two kinds of pulses, i.e., the first and the second pulses. In addition, the system has a characteristics that the system is easily utilized by users since a set time duration is equal to a reset time duration.

The method to generate a current to flow to the opposite direction is described below with reference to FIG. 1A. The memory cell 151 comprises the select transistor 152 and the information storage section 153. The select transistor is of N channel type. Of course, P channel type transistor may be used also for this. The gate of the select transistor is connected to the word line 184, and the drain of the transistor is connected to the bit line 186. The information storage section is located between the source of the select transistor and the source line 185. In the write operation, an electric voltage is first applied to the word line and then to the source line. By this procedure a pulse current flows from the source line and through the select transistor and the information storage section and then to the bit line. The above mentioned pulse current is shown as the first pulse current 171 in FIG. 1C. Next, the voltage of the source line is turned to 0 volt, and a voltage is applied to the bit line. Thus, a pulse current flows from the bit line and through the information storage section and the select transistor and then to the source line. The above mentioned pulse current is shown as the second pulse current 172 in FIG. 1C. And next, the voltages of both the source line and the word line are turned to 0 volt. By the above operations, the direction of the current passing through the information storage section can be switched from one to the other. The present system has an advantage that the circuit configuration of the word driver considerably simple since the word line voltage takes only two values.

Naturally, it is also possible to raise the bit line voltage before raising the word line voltage, and inversely to lower the word line voltage before lowering the source line voltage.

Furthermore, the following method can be also used. Before the write operation, all the voltages of the word line 184, the bit line 186, and the source line 185 are maintained at ½ VDD. First, raise the word line 184 to VDD, then lower the bit line 186 to the middle potential of 0 V and ½ VDD. By this procedure, a pulse current flows from the source line, through the select transistor and the information storage section and to the bit line. This pulse current corresponds to the first pulse 171 shown in FIG. 1C. Next, raise the bit line to the middle potential of ½ VDD and VDD. By this procedure, a pulse current flows from the bit line, through the information storage section and the select transistor and to the source line. This pulse current corresponds to the second pulse172 shown in FIG. 1C. Using this method, since a direct voltage of ½ VDD is applied to the source line, an adjacent memory cell and the source line 185 are enabled to be common. Accordingly, the area of the memory cells can be smaller.

Besides, the information storage section may be located between the bit line and the select transistor, a junction type transistor or a bipolar transistor may be used as the select element.

Another characteristics of the present embodiment is that a voltage pulse duration applied to the bit line and the source line is short. The above mentioned pulse width is, for example, equal to or less than 100 ns.

Second Embodiment

Figure 12:
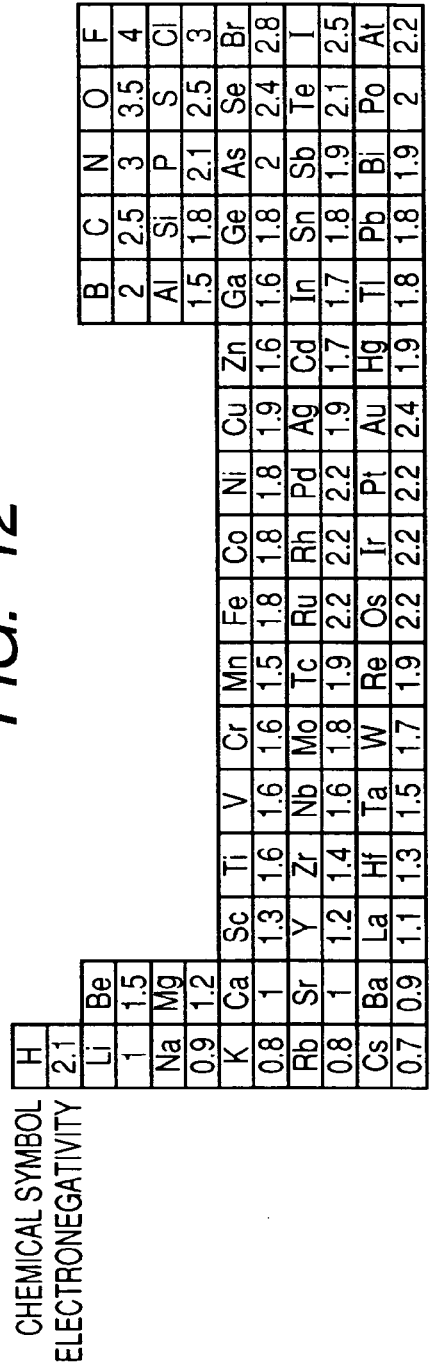
FIG. 12 is a table of chemical elements and electron negativities.

The segregation in the composition of the chalcogenide can be prevented by the present invention disclosed. The chalcogenide, which has been unable to be used since the segregation was easily produced in the prior art, is now available. A criterion for segregation production is a difference in electronegativity between atomic elements composing the storage materials. The composition of the chalcogenide studied mainly as a material for a phase change storage memory is Ge—Sb—Te. As shown in a table in FIG. 12, the electron negativity for Ge is 1.8, for Sb 1.9, and for Te 2.2. Therefore, since a Te element is a relatively negative, it drifts toward the positive electrode. For the electronegativity of the three kinds of element, Ge—Sb—Te, Ge has the minimum value, Te has the maximum, and the difference between the two is 0.3.

For the chalcogenide with the difference in electronegativity of larger than 0.3 between its composing elements, there was a problem the segregation had been frequently produced. On the other hand, the chalcogenide has an advantage that since it has a large difference in electronegativity between its composing elements, an ion binding is strong enough between its composing elements, that the temperature of crystallization rises, resulting in an improvement of the 10 year data retaining temperature rising.

By utilizing the embodiments disclosed in the present invention, it is enabled to implement a phase change memory device having a capability of multiple write operations together with an allowable high temperature for retaining data for 10 years.

AS examples of the chalcogenide composition, $Ge_2 Sb_2 Se_5$, $Ge_2 Sb_2 S_5$ or Zn—Ge—Sb—Te may be used.

Third Embodiment

Figure 13:
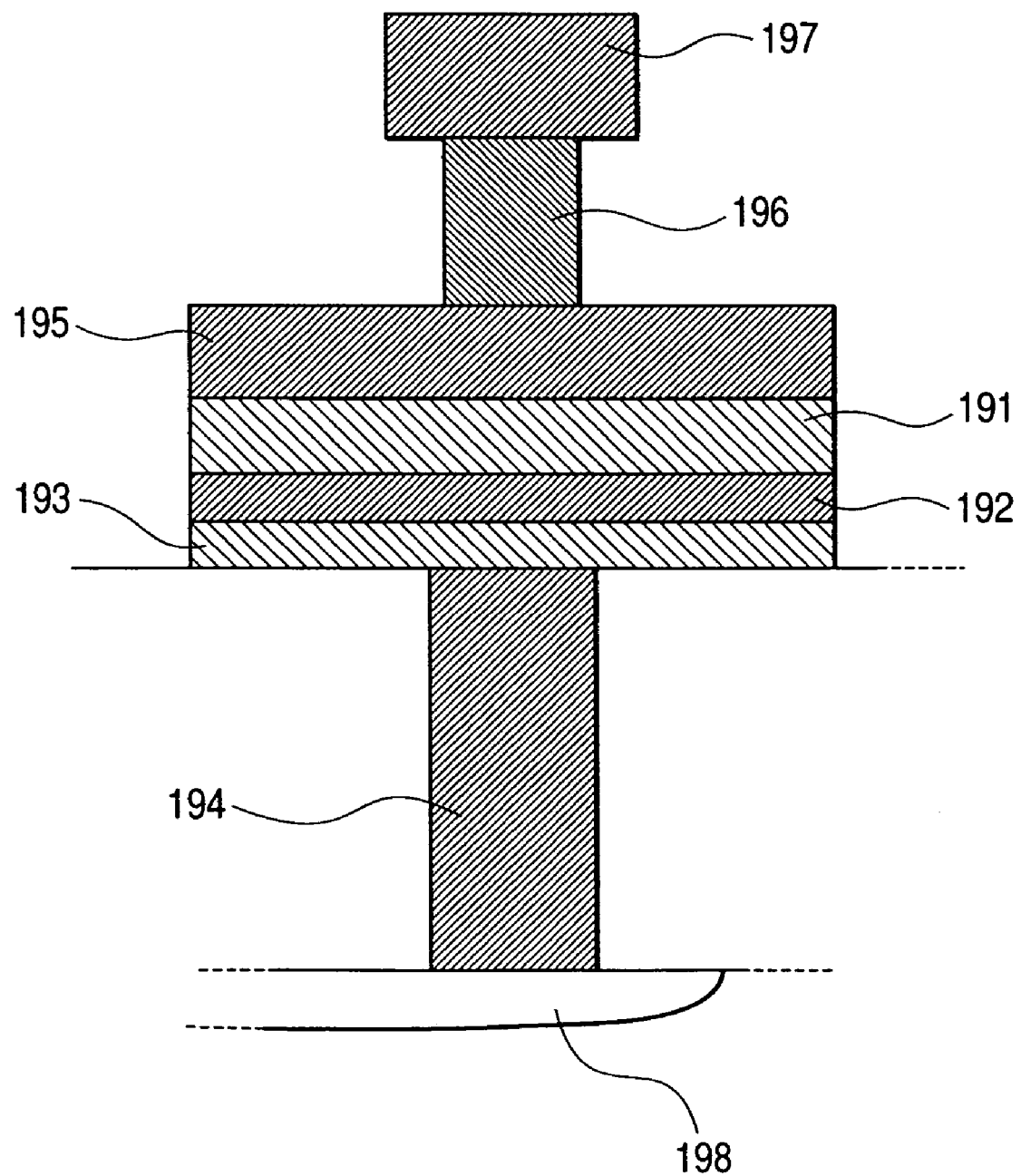
FIG. 13 is a schematic cross sectional view of a memory cell of third embodiment in accordance with the present invention.

FIG. 13 shows a schematic cross sectional view of a storage section of the memory cell according to fourth embodiment of the present invention. An bonding layer 192, a heater layer 193, and the chalcogenide are sandwiched between the electrode 195 and the electrode 196. Here, the bonding layer 192 is arranged not to produce any space between the chalcogenide and the electrode 195 at a memory fabrication process or at the memory operations. The heater layer is arranged to produce joule heat efficiently when the write current flows. With such a structure, since composing atoms from the heater layer or the bonding layer diffuse into the chalcogenide, that the materials with a large diffusion velocity could not be utilized as the heater layer or the bonding layer. However, by the present system of switching the direction of the current, such elements with a large diffusion velocity as Si and C, which could not be used in the prior art, become available to be used for a heater layer or a bonding layer since the prevention of these elements from diffusing arising from ion conductivity is implemented. Si has a character to be well matched to the semiconductor fabrication process, and C is a material with a strong bonding force, therefore, they have an advantage of easy production process.

Fourth Embodiment

Figure 14A:
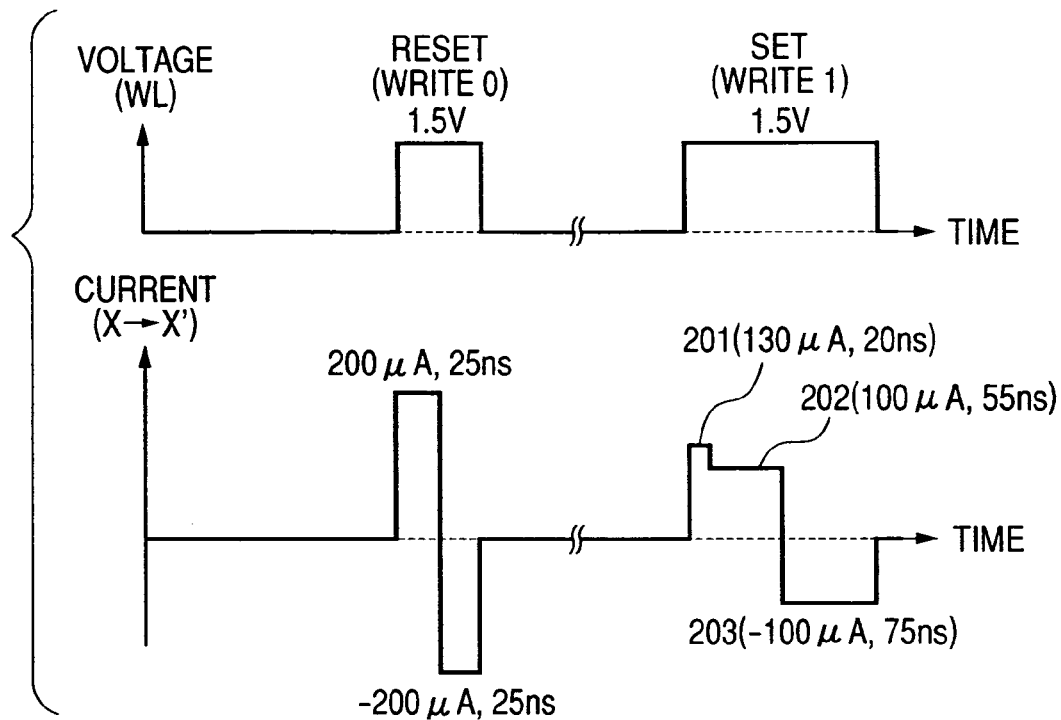
FIG. 14A shows a voltage and a current wave forms in the circuit of a memory cell of fourth embodiment in accordance with the present invention.

FIG. 14A shows an embodiment wherein in the set operation, the current flow of the first pulse 201 and the second pulse 203 have the opposite direction, and furthermore, the first pulse 201 has a portion 201 of especially large current at its front in the pulse. By the portion 201, a high voltage is applied to the chalcogenide for a short time, e.g. 20 ns, to produce Ovonyx switching, and the resistivity of the chalcogenide decreases. Therefore, the voltages to be applied to the chalcogenide can be low, when the pulse current 202 or 203 flows. By utilizing the present system in the set operation, another advantage is implemented to enable the required electric power to decrease.

Figure 14B:
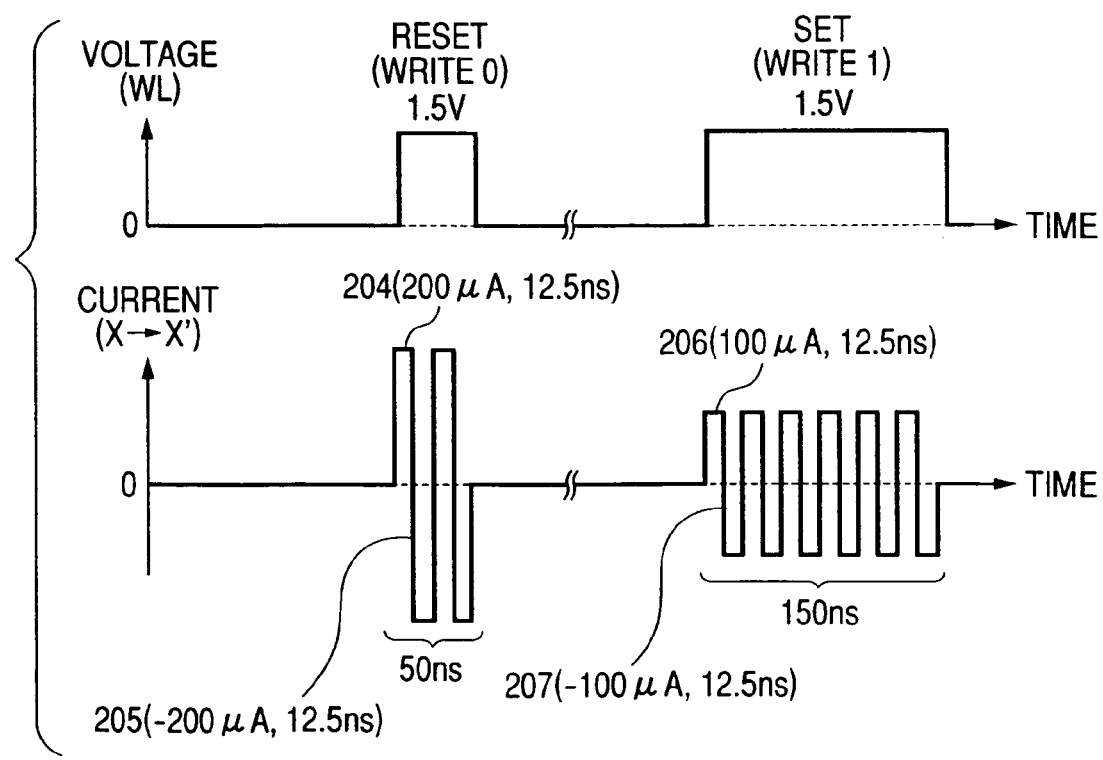
FIG. 14B shows a wave form diagram of another procedure in the circuit of a memory cell of fourth embodiment in accordance with the present invention.

FIG. 14B shows an embodiment wherein the current direction is switched more than once. By increasing the number of switching times, enabling the current direction switching for a short interval, shorter than the time duration required for the atoms to drift, the segregation of the composition is prevented.

On one hand, the phase change memory requires an electric current flow within a range wherein any change will not occur to the phase change resistor state to prevent information damage at a read operation, and hence, a lower current flows than the current required in the write operation. On the other hand, a low current results in a slow speed. That is, the read current is required to be low from an information protection point of view, while, the read current is required to be high from the read speed point of view, that is a trade-off relation. From the read speed point of view, a high speed read operation is enabled by reading a data with destruction; however, a rewrite operation is required to sustain the data, resulting in the increase in the number of write operations and the deterioration of the reliability. For such a destructive read operation, the above mentioned reversed pulses with a positive and a negative polarity are utilized most conveniently. That is, the suppression of the composition segregation and the increase the number of write operations are enabled, making the destructive read/rewrite operations possible. In the following, preferable embodiments of the semiconductor storage device in accordance with the present invention are explained with reference to accompanied drawings. At first, the method is described to accelerate the read speed to a high speed (a destructive data read followed by a rewrite), and then a circuit configuration is described wherein the number of rewrite operations is increased by introducing the above described technique to utilize a positive and a negative pulses. The circuit elements constituting each functional block of the embodiments are not limited to specific ones; however, these are formed on one semiconductor substrate, e.g. a single crystal silicon substrate, using an integrated circuit technology, such as a well known CMOS (complementary metal-oxide semiconductor) transistor and the like. Although any connections of the MOS transistor substrate to the voltage source are not specially shown in the drawings, the connection manner is not limited as far as the CMOS transistors operate properly. And as far as not specially commented, a low level signal is indicated by 'L' and a high level signal by 'H'.

Fifth Embodiment

Memory Module Architecture

Figure 15:
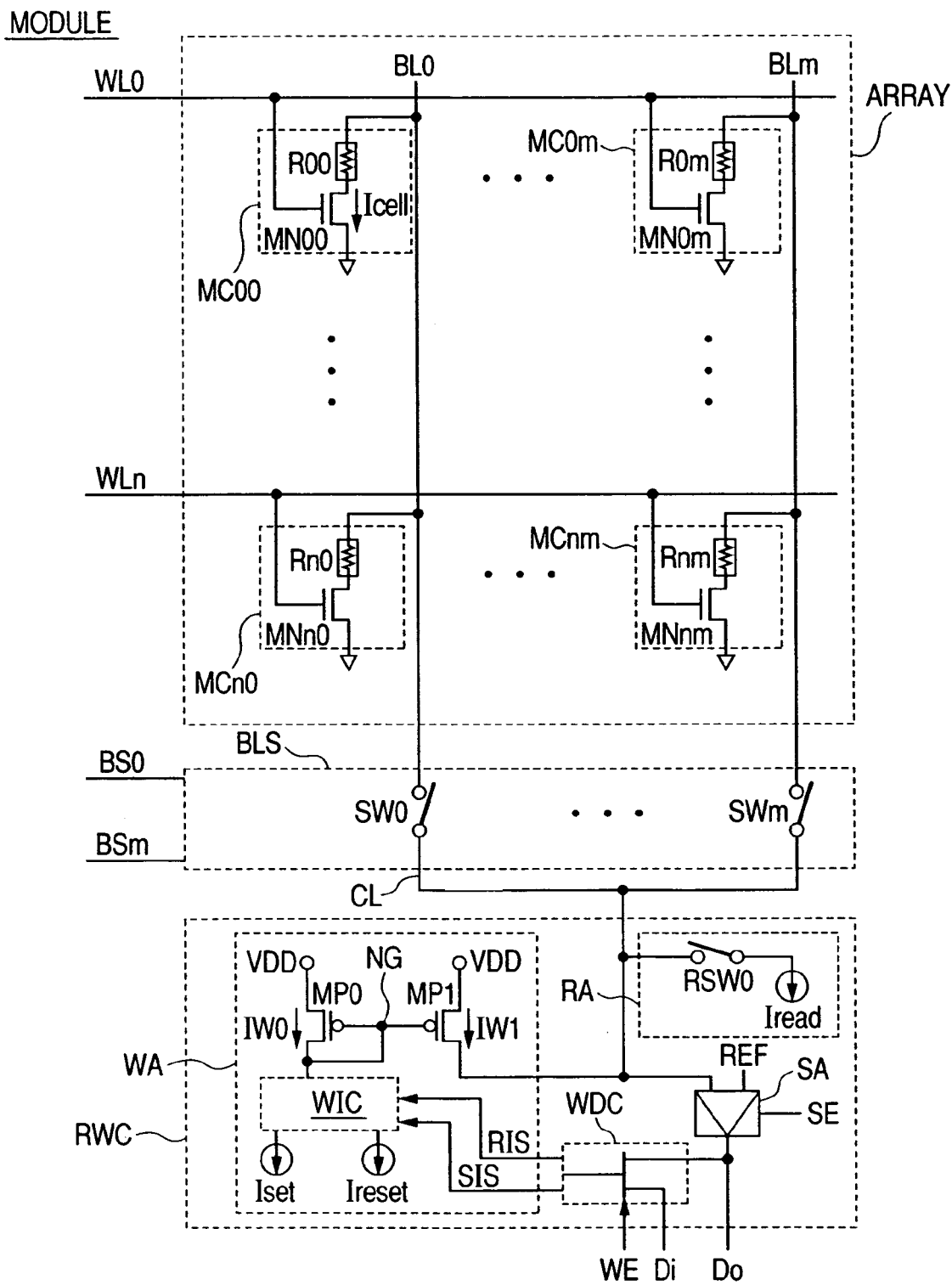
FIG. 15 is a circuit diagram of a memory module of fifth embodiment in accordance with the present invention.

The memory module architecture is explained in detail with reference to FIG. 15. The memory array ARRAY, composing the memory module, comprises a plurality of word lines WL and a plurality of bit lines BL, wherein a memory cell is connected to the crossing point of a word line WL and a bit line BL. Each memory cell MC comprises an N channel type MOS transistor MN00 and a storage element R00 as illustrated in FIG. 15. The storage element R00 is an element called a phase change register characterized in that, fore example, having a low resistance of 1 k$\Omega$ to 10 k$\Omega$ if it is in a crystalline state, whereas, a high resistance of equal to or larger than 100 k$\Omega$ if it is in an amorphous state. The word line WL0 is connected to the gate electrode of the N channel type MOS transistor MN00, and controls the N channel type MOS transistor to an on- state if it is selected, and to off- state if it is not selected. A terminal of the storage element R00 is connected to the bit line BL0, and the other terminal to the drain electrode of the MOS transistor MN00. The source electrode of the MOS transistor MN00 is grounded to the earth potential. In the present embodiment, a phase change element is connected between a bit line BL and an N channel type MOS transistor MN; however, it may be connected between the earth potential and an N channel type MOS transistor. And, a bipolar transistor may be used instead of a MOS transistor MN00.

An X system address decoder block is connected to a word line WL, and an X system address signal selects one of the word lines WL.

A bit line select circuit BLS is connected to a bit line BL, which is selectively connected to a common line CL. A switch SW is controlled by a bit line select signal BS from a Y system address decoder block.

A read and write circuit RWC comprises a sense amplifier SA, a write amplifier WA, write data select circuit VDC, and a read control circuit RA. The sense amplifier SA amplifies a signal from a common line CL. The read control circuit RA comprises a switch RSW and an electric current source (Iread) The write amplifier WA comprises a P channel type MOS transistor (MP0, MP1), a current source (Iset, Ireset), and a write current select circuit WIC, and constitutes an current mirror circuit. The electric power source with a potential VDD is connected to the source electrode of the P channel type MOS transistor MP0, and a node NG is to the gate electrode and the drain electrode, whereas, the power source with a potential VDD is connected to the source electrode of the P channel type MOS transistor MP1, and a node NG is to the gate electrode, and a common line CL is to the drain electrode, respectively. A current source (a set current source Iset or a reset current source Ireset) is connected to the node NG by a write current select circuit WIC. The potential of node NG varies to make the current from the connected current source equal to the current IW0 flowing through the MP0. The potential difference between the gate and the source of the transistor MP1 is just the same as that of the transistor MP0, and therefore, the current IW1 is the same as the current IW0. As a result, the current flowing through the bit line BL becomes same as the current from the current source to the nod NG connected thereto.

The write data select circuit WDC, whereto a write control signal WE, an input data Di, and an output data Do are input, outputs write signals (a reset current select signal RIS, a set current select signal SIS) to the write data select circuit VIC.

Figure 16:
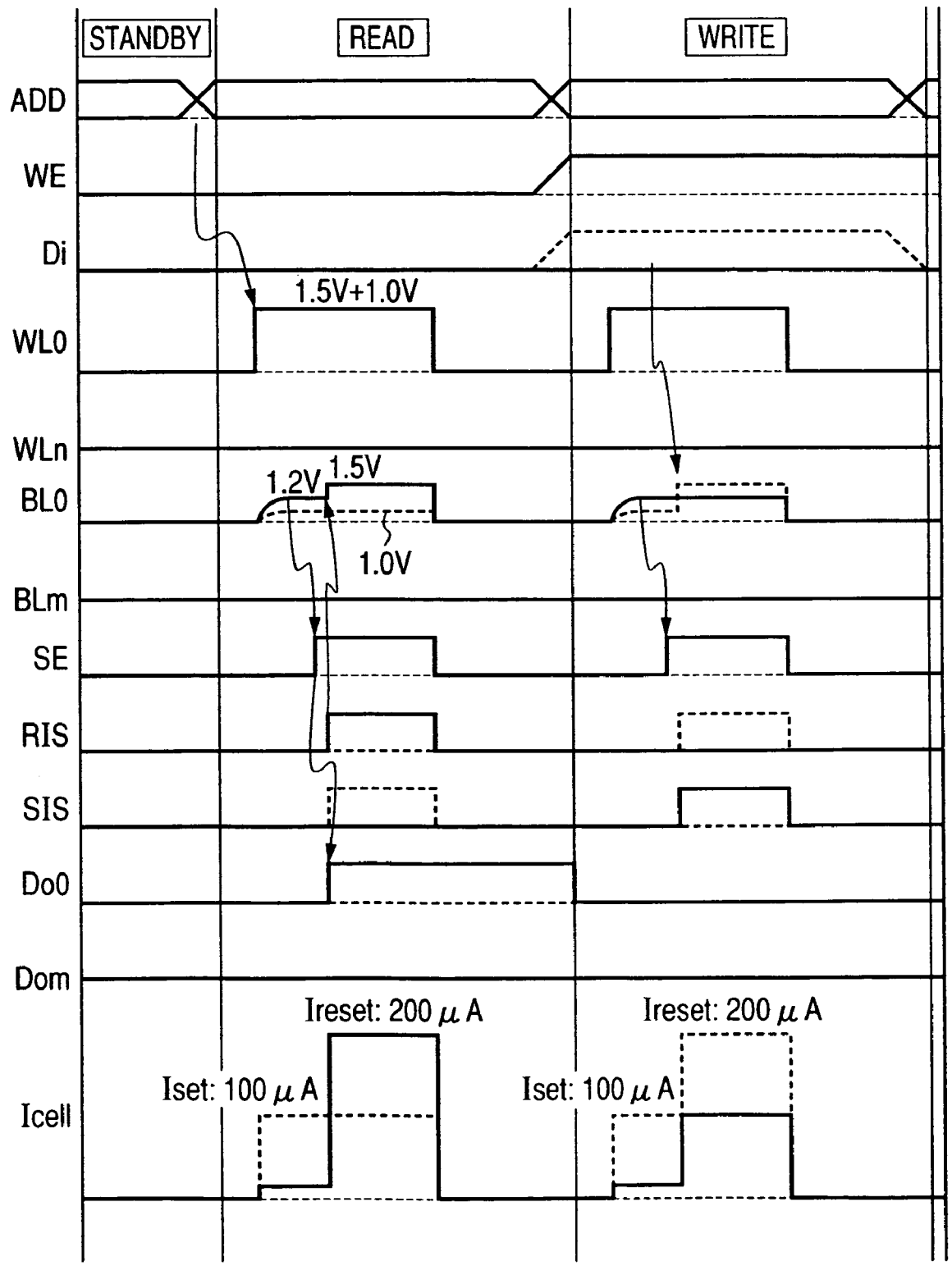
FIG. 16 is operational wave forms of the circuit in FIG. 15.

Operation System Next, with reference to FIG. 16, the operation is explained in detail. The voltage VDD of the electric power source for the inner circuits is, e.g. 1.5 V. First, it is in a wait state STANDBY, an address ADD is changed, and a write signal becomes 'L', then the read operation READ begins. Here, the case of a read operation of '1' (a reset (high resistance) state) from the memory cellMC00 is described, and shown by solid lines in FIG. 16. The case to read '0' (a set (low resistance) state) is shown by broken lines.

Figure 17:
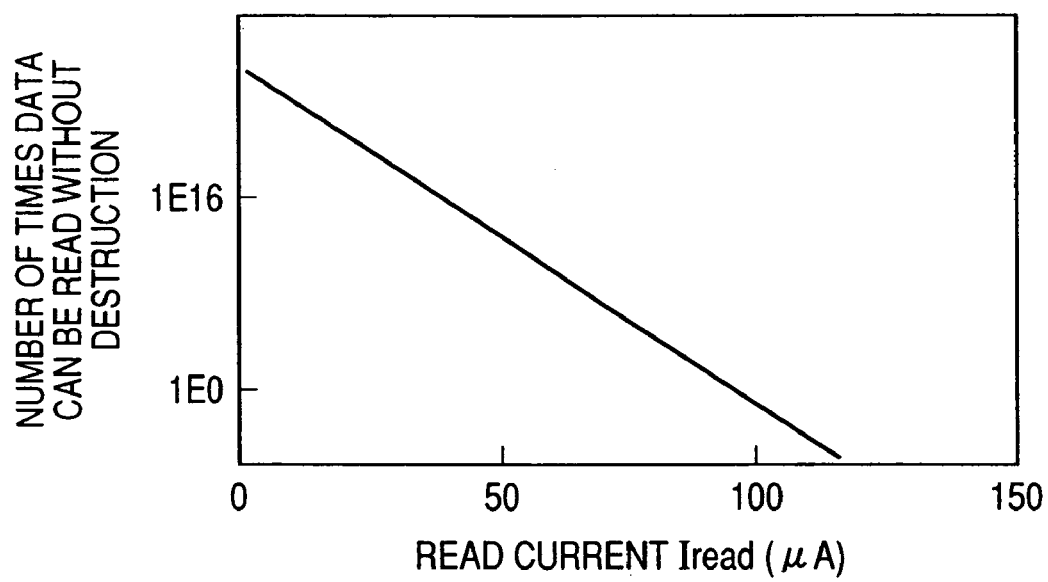
FIG. 17 shows a relation of number of times data can be read without destruction vs. read current

The word lineWL0 is activated from 'L' to 'H', at the same time the switch RSW is switched on, and the driving current Iread flows through the bit line BL. A phase change element is the one wherein its crystalline state changes by heat, especially when it is in a amorphous (reset) state, it is gradually crystallized (set) by heating caused by a low current. Since this change is integrated that, in the prior art, the read operation required a lower current than that in the write operation in order to make the crystallization slower even a little. The relation between Iread and number of read times is shown in FIG. 17. For example, if 100 μA current flows through the element, a data is destructed by data read operation only once, whereas, if it is about 10 μA flowing through the element, then data read operations will be executed almost infinitely. However, with the current of about 10 μA, it takes time to change the bit line potential, and the read velocity is slow. Therefore in the present invention, Iread is made high, e.g. 100 pA to make data read speed high. However, data destruction may take place, a rewrite operation is executed for the destructed data.

If the read current Iread flows through the bit line BL0, the memory cell MC 00, wherein a high resistance value, e.g. 100 kΩ (corresponding to '1') has been already written, the potential of the bit line BL rises to those near the power source, e.g. 1.2 V. If a low resistance value, e.g. 10 kΩ (corresponding to '0') has been written to the memory cell MC00, the potential of the bit line BL0 does not rise so much, and becomes around 1.0 V. These voltages are compared with the reference voltage REH at the sense amplifier circuit SA which has been activated by making a sense amplifier activation signal SE to 'H'. The potential difference is amplified and sent to output to the D0, and the read operation ends. If a high resistance value is written to the memory cell MC00, '1' is output to D0, and if a low resistance value is written, then '0' is output to D0.

In the present embodiment, the read data is rewritten after the read operation. This ensures no problems about data destruction at the read operations.

In the present embodiment, a data '1' is read, and the read data is sent to the write data select circuit WDC, the reset current select signal RIS changes from 'L' to 'H'. By this procedure, the write current select circuit WIC is driven, and connects the current source Ireset to the NG. As a result, the current WI of P channel type MOS transistor MP1 becomes also Ireset and flows toward the bit line BL0.

The reset current Ireset is e.g., 200 μA. In the case wherein a data is destructed by the read operation and the resistance of the element lowers, the 200 μA current keeps flowing, and the bit line potential rises to nearly the same potential of the power source. And, even if the element resistance is not lowered by the read operation, the element resistance is lowered by the reset current Ireset, the 200 μA current keeps flowing. By continuing this state from 5 ns to a few tens of ns, the element becomes a liquid-state. After that, by falling down the current quickly flowing through the element and by cooling the element rapidly, the storage element R00 becomes in an amorphous state with a high resistance (corresponding to data '1'). The bit line BL not selected is connected to the earth potential.

If '0' is detected, the memory element R is in a set state and its resistance value does not change even if the read current Iread flows at the write operation, accordingly, there is no need to rewrite back the data. However in the present example, even if '0' is detected, the write back operation is executed to make the control system simple. In this case, after the read operation the set current Iset was fed by the write amplifier WA to the bit line BL0. The resistance of the element is low enough that a current of 100 μA keeps to flow for about 100 ns, then the write operation ends.

When the write operation ends, the word line WL0 is switched from 'H' to 'L', and the set operation ends. After a data is read, the write operation selects an external input data Di utilizing a write data select circuit WDC, and based on the data Di, and controlling the reset current select signal RIS and the set current select signal SIS, executes the write operation.

The waveforms indicated by the solid lines of the present embodiment shown in FIG, show that after read'1', write '0', and the waveforms indicated by the broken lines show that after read'0', write '1'. In the case to write '0', the SIS signal is switched from 'L' to 'H', and the set current Iset flows to the bit line BL, and the element is set. In the case of write '1', the RIS signal is switched from. 'L' to 'H', and the reset current Ireset flows to the bit line BL, and the element is reset.

The read operation is not required at the write operation WRITE, the same control is executed as the read operation READ in order to simplify the control.

Figure 18:
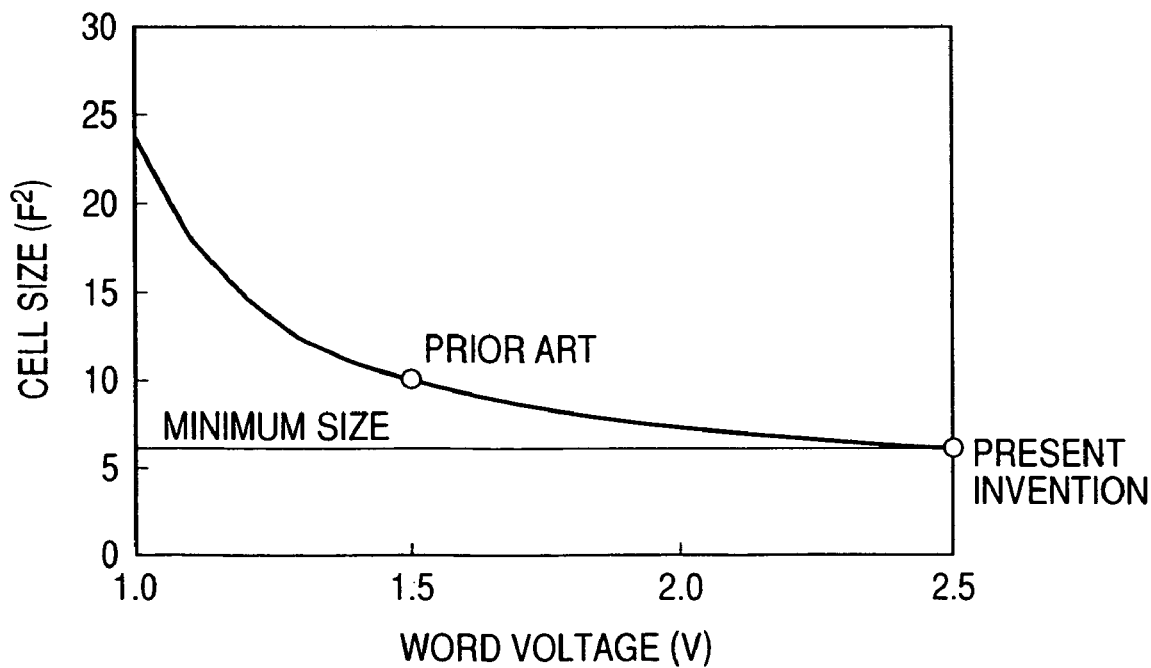
FIG. 18 is a relation of cell size vs. word voltage showing the word line boost.

In the present example, the 200 μA current of Ireset is required to flow through the element at the reset operation. Accordingly, a power source is also required capable to feed a similar magnitude of current to an N channel type MOS transistor of the memory cell MC. To increase the current driving power, the transistor gate width must be large, however, this results in a large size memory cell. Therefore, instead of making the gate width large, the current driving power is increased by boosting the word line WL voltage at 'H'to the one higher than the source voltage VDD. In the present example, the word line voltage is 2.5 V, higher than the source voltage VDD by 1.0 V. FIG. 18 shows the relation between the memory cell size and the word voltage required for the 200 μA current of Ireset. If the word voltage is increased, then the flowing current increases, enabling the gate width relatively smaller, and the cell size smaller. In the case wherein the word voltage is boosted to 2.5 V, when compared with the case the word voltage is 1.5 V, the gate width made large, results in the cell area of about 60%, and the cell size 6F2. Taking into account of reliability, a boosting voltage of less than 5 MV/cmvolts must be applied to the gate electrode.

To increase the current driving power for an N channel type MOS transistor MN of the memory cell MC, another method is to decrease the threshold of the [transistor]. In this case, the voltage of the word line at 'H' can be the source voltage VDD, however, the leakage current increases when not selected, accordingly, a negative pulse is required to be applied when the word line is 'L'. If the threshold value is lowered by 0.5 V, which has the same effect of boosting the word line by 2 V, however, a negative voltage pulse of –0.5 V must be applied to the word line WL when not selected.

Figure 19:
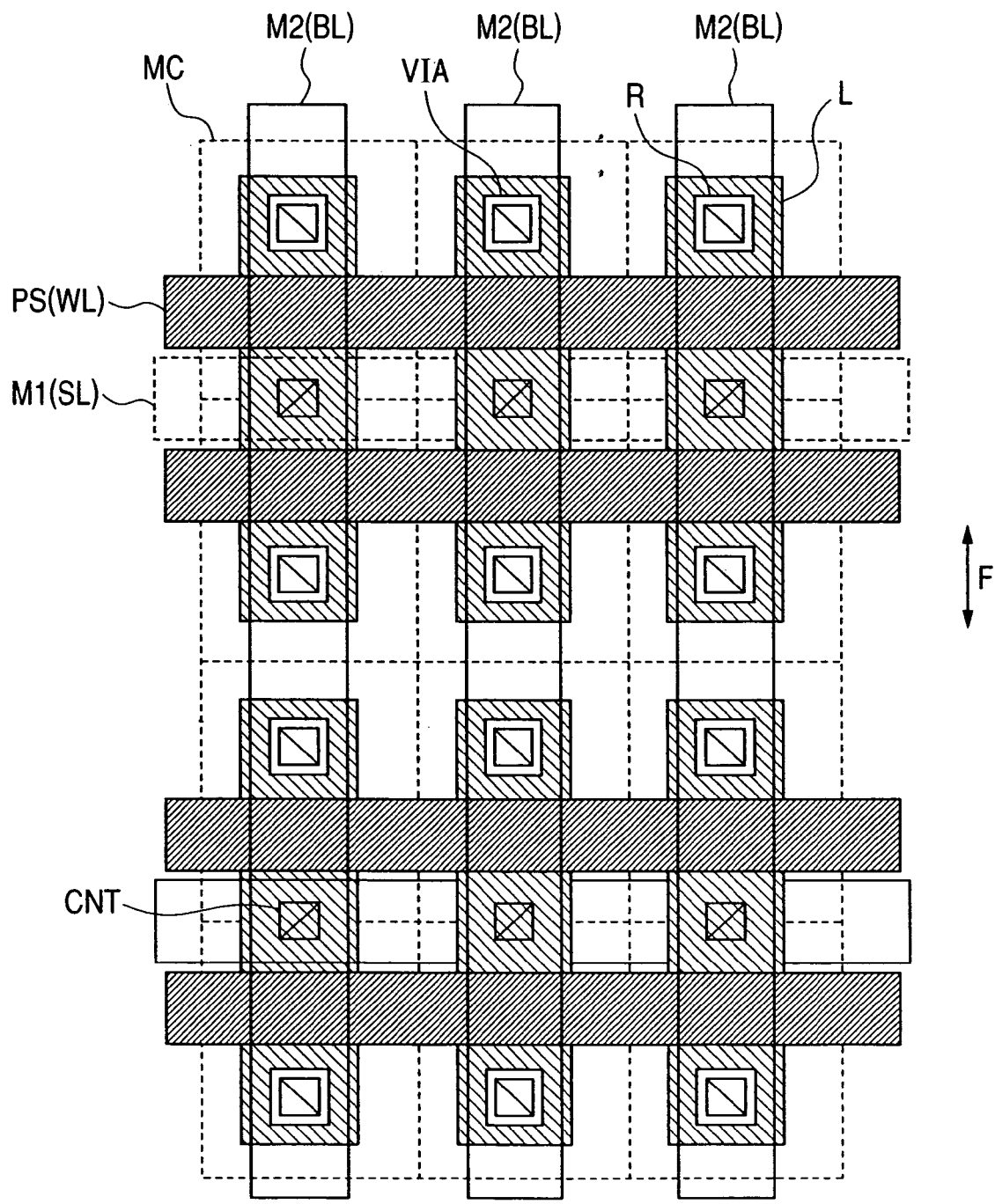
FIG. 19 is a plan view of memory array of fifth embodiment in accordance with the present invention.

FIG. 19 shows a plan view of a memory array. The word line WL is formed from a poly-silicon layer (PS), the source line SL is from the first wiring layer M1, and the bit line BL is from the second wiring layer M2. The diffusion layer L and the wiring layer M1 are connected with contact CNT, and the wiring layer M1 and the wiring layer M2 are connected with via VIA, respectively.

[In the Case to Control Word Line]

Figure 20:
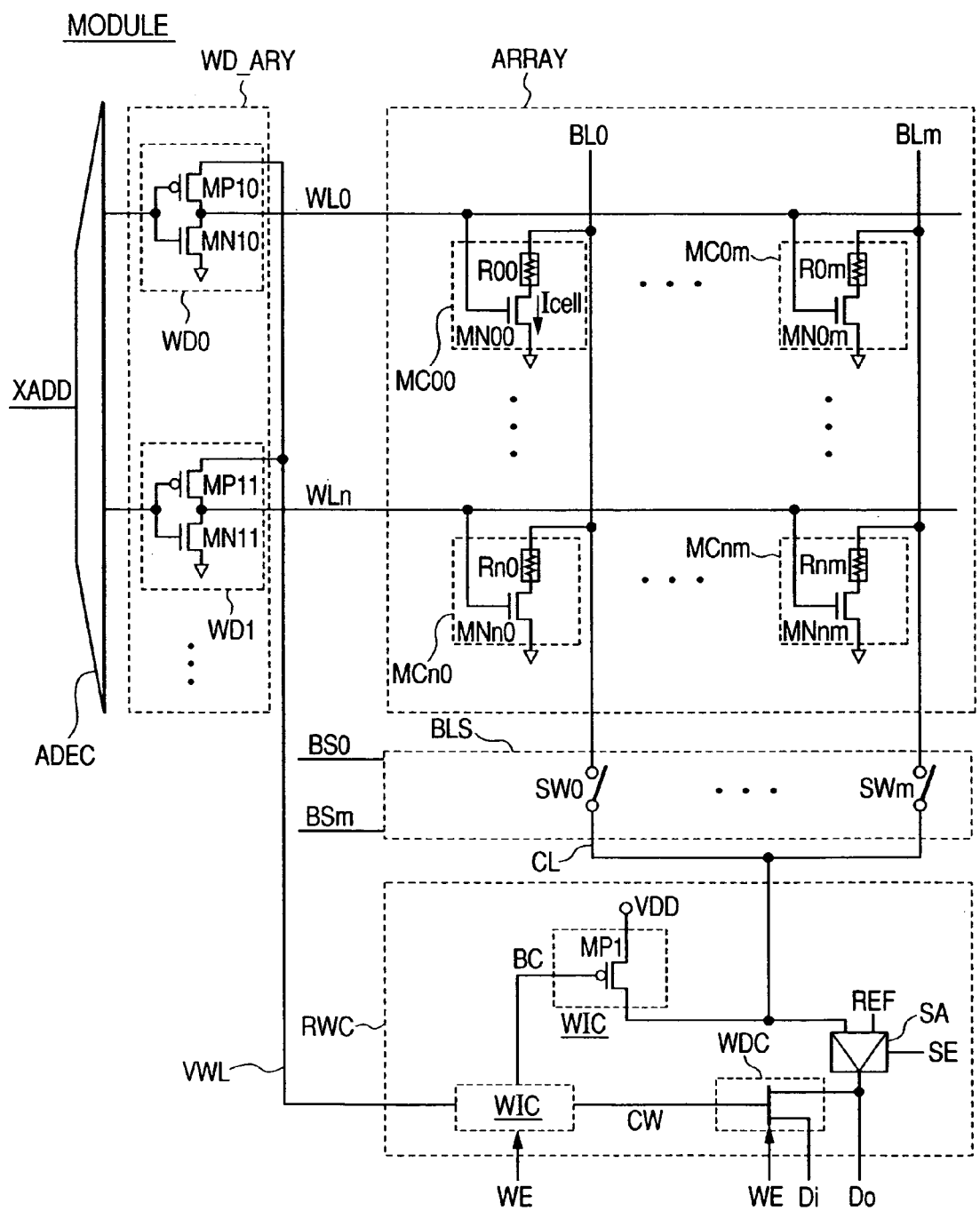
FIG. 20 is a circuit diagram of a memory module of fifth embodiment in accordance with the present invention.

FIG. 20 illustrates a memory module controlling the word, line according with the present invention. The memory module includes an memory array ARRAY comprising a plurality of word lines WL and a plurality of bit lines BL, wherein memory cells are connected to the crossing points of the word lines WL and the bit lines BL Each memory cell MC, as is illustrated by a memorycellMC00, comprises an N channel type MOS transistorMN00 and a storage element R00. The storage element R00 is a resistor called a phase change resistor. A word driver array WD_ARY is connected to the word line, X system address signal XADD is decoded by an X system address decoder ADBC, and one of the word lines WL is selected. The word driver array WD_ARY comprises word drivers WD, and for example, a word driver WD0 is an inverter circuit, including an N channel type MOS transistor MN 10 and a P channel type MOS transistor MP 10. The output of the inverter is connected to the word line WL, and the source electrode of P channel type MOS transistor MP 10 is connected to a power source line VWL.

A bit line select circuit BLS is connected to the bit line BL, which is selectively connected to a common line by switches SW. The switch SW is controlled by a bit line select signal BS from Y system address decoder block.

A read write circuit RWC comprises a sense amplifier SA, a write amplifier WA, a write data select circuit WDC, and a write control circuit WIC. The write data select circuit WDC is accessed by the write control signal WE, an input data Di, and an output data Do, outputs a control signal CW to a write control circuit WIC. The write control circuit WIC controls the power source line VWL and a signal BS based on the CE signals. The write amplifier WA comprises the P channel type MOS transistor MP 1, a control signal BC is input to the gate electrode of the amplifier WA.

[Operation System]

Figure 21:
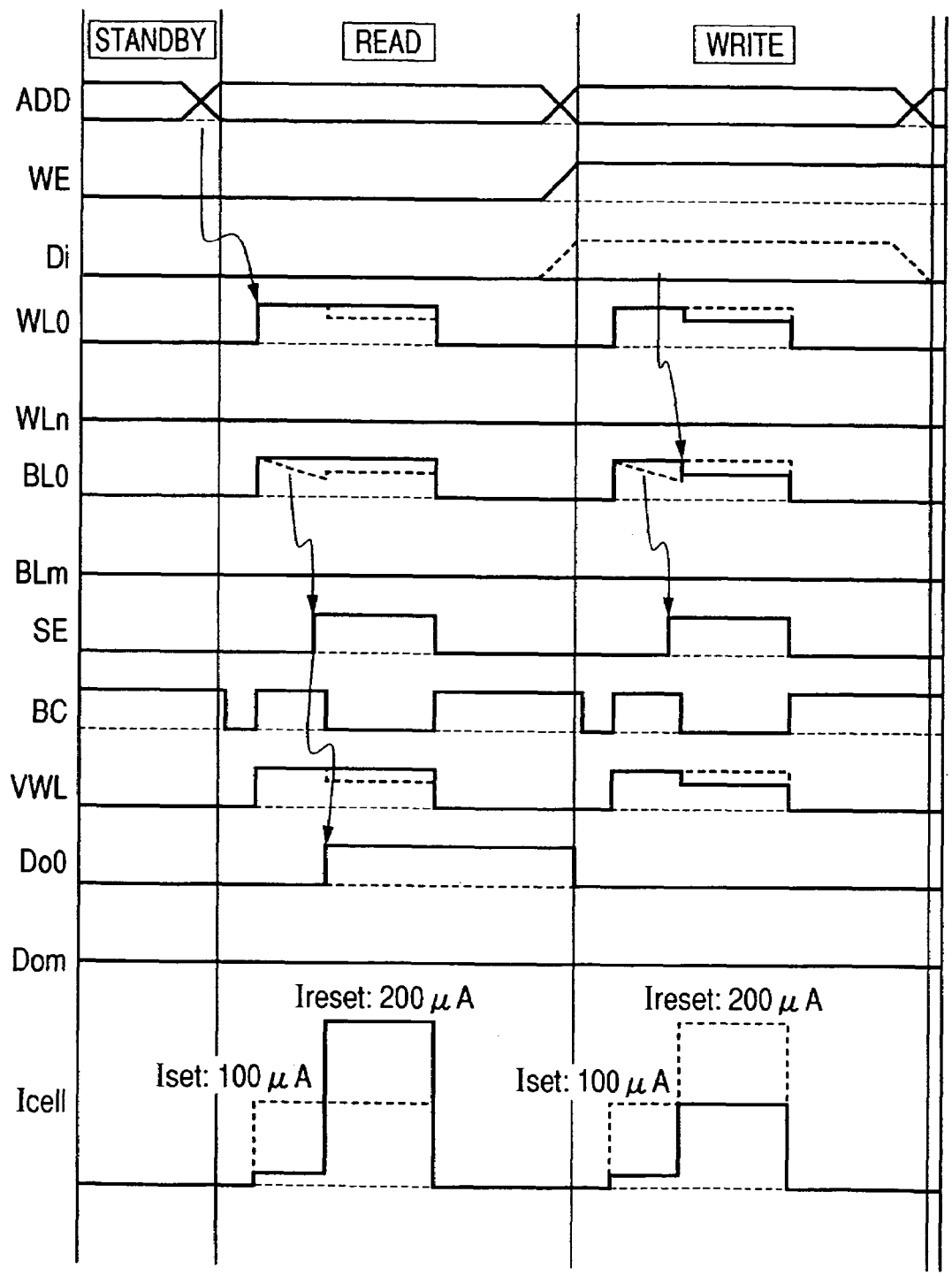
FIG. 21 is other operational wave forms of the circuit in FIG. 15.

FIG. 21 shows wave forms at various positions in the system, the operation is explained in detail therewith. The source voltage VDD for internal circuits is e.g., 1.5 V. At the beginning, the system is in a standby state STANDBY, an address ADD is switched to another, and when the write control signal WE becomes 'L', the read operation READ begins. Here, '1' (reset(high resistance) state) is read from the memory cellMC00 is mainly described. The operation for this case is indicated by solid lines and in the case to read '0' (set(low resistance) state) is indicated by broken lines in FIG. 16.

First, the bit line BL0 is precharged by setting the control signal BC to 'L'. The word line WL is activated from 'L' to 'H', the memory cellMC00 let the current flow from the bit lineBL0. A high resistance value e.g., 100 kΩ (corresponding to '1') is already written into the memory cell MC00, the bit line BL0 potential does not change almost and, e.g., 1.5 V. If the resistance value of e.g., 10 kΩ (corresponding to data '0') is written into the memory cell MC00, the bit line voltage drops to about 0.5 V. By activating the sense amplifier activation signal SE to 'H', the sense amplifier circuit SA compares the BL0 potential with the reference voltage REF, and the resulting difference voltage is amplified. The amplified data is output to Do and the read operation ends. If a high resistance value is written into the memory cell MC00, '1' is output to D0, and if a low resistance value is written into the memory cell MC00, '0' is output to D0.

In the present embodiment, after a read, the read data is rewritten, hence, data destruction at the read does not cause any problems.

In the present example, '1' has been already read, and the read data is sent to the write data select circuit WDC generating a signal CW. As a result, the power source line VWL and the signal BC are controlled by write control circuit WIC. In the case '1' is read, the bit line voltage is raised to the power source voltage 1.5 V, and the word line voltage remains at the power source voltage 1.5 V.

In the case wherein the resistance of an element is high before a data read operation, whereas, the data is destructed by the read operation, and the resistance falls down, the reset current Ireset of 200 μA flows. Even if the resistance of the element does not fall down by the read operation, the resistance of the element is lowered by the reset current Ireset and 200 μA reset current keeps flowing. Keeping this state for 5 ns to a few tens of ns, the element changes to a melting state. Then, lowering the current flowing through the element instantaneously, and cooling the element rapidly, then the storage element R00 becomes amorphous with a high resistance (corresponding to data '1').

The non-select bit line BL is connected to the earth potential.

In the case '0' is read, the storage element R is in a set state, therefore, the resistance of the element does not change when the read current Iread flows at a data read operation, and the data rewrite operation is not required. However in the present example, even in the case '0' is read and the storage element R is in a set state, the data rewrite operation is executed in order to make the control system simple. In this case, after the read operation, the bit line voltage is the same as that of the power source 1.5 V, the word line voltage is 1.0 V, and a current of 100 μA keeps flowing, since the element resistance is lowered. This state is kept for about 100 ns, and the write operation ends.

[43] When the write operation ends, the word line shifts from 'H' to 'L' and the set operation ends. The write operation WRITE, after data read, select an external input data Di by the write data select circuit WDC, and then write the data by controlling the power source voltage based on the data.

[44] The wave form diagram indicated by solid lines in the present embodiment shows after read '1', then write '0', the wave form diagram indicated by broken lines shows after read '0', then write '1'. At the write operation WRITE, the read operation is not necessary, but the same control as for the read READ is executed for the simplicity of control system.

Sixth Embodiment

A procedure is explained to apply a current pulse before a rewrite or write operation. The procedure enables the write operation to execute without any limit to the number of times. Furthermore, in the present embodiment, the current source for a set operation Iset and the current source for a read operation Iread are shared to remove the read control circuit RA and to result in less area is required for the module.

(Memory Module Architecture)

Figure 22:
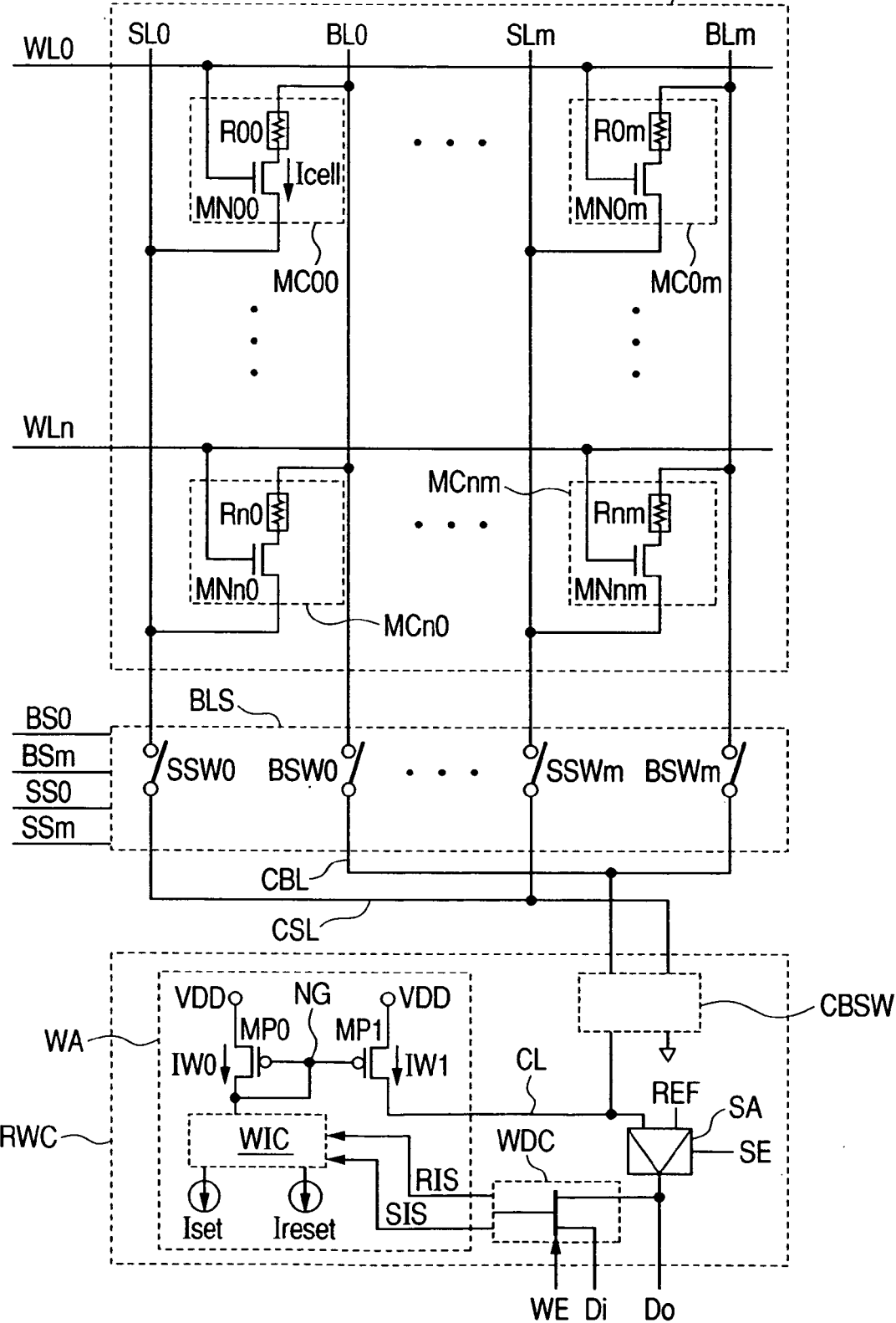
FIG. 22 is a circuit diagram of a memory module of sixth embodiment in accordance with the present invention.

FIG. 22 shows the memory module architecture of the present embodiment, however, only different points from the first embodiment are described. The source line SL is not connected to the earth potential, and formed in parallel to the bit line BL, and connected to the common source line CSL at the bit line select circuit. For example, the source line SL0 is connected to the common source line by the source line switch SSW0. And the bit line BL is also connected to the common bit line by the bit line select circuit BLS, e.g., the bit line BL0 is connected to the common bit line CBL by the bit line switch BSW0. The bit line switch BSW is controlled by the bit line select signal BS, and the source line switch SSW is controlled by the source line select signal SS, respectively.

The common bit line CBL and the common source line CSL are both input to the cross bar switch CBSW, and connected to the common line CL or to the earth potential.

(Operation Procedure)

Figure 23:
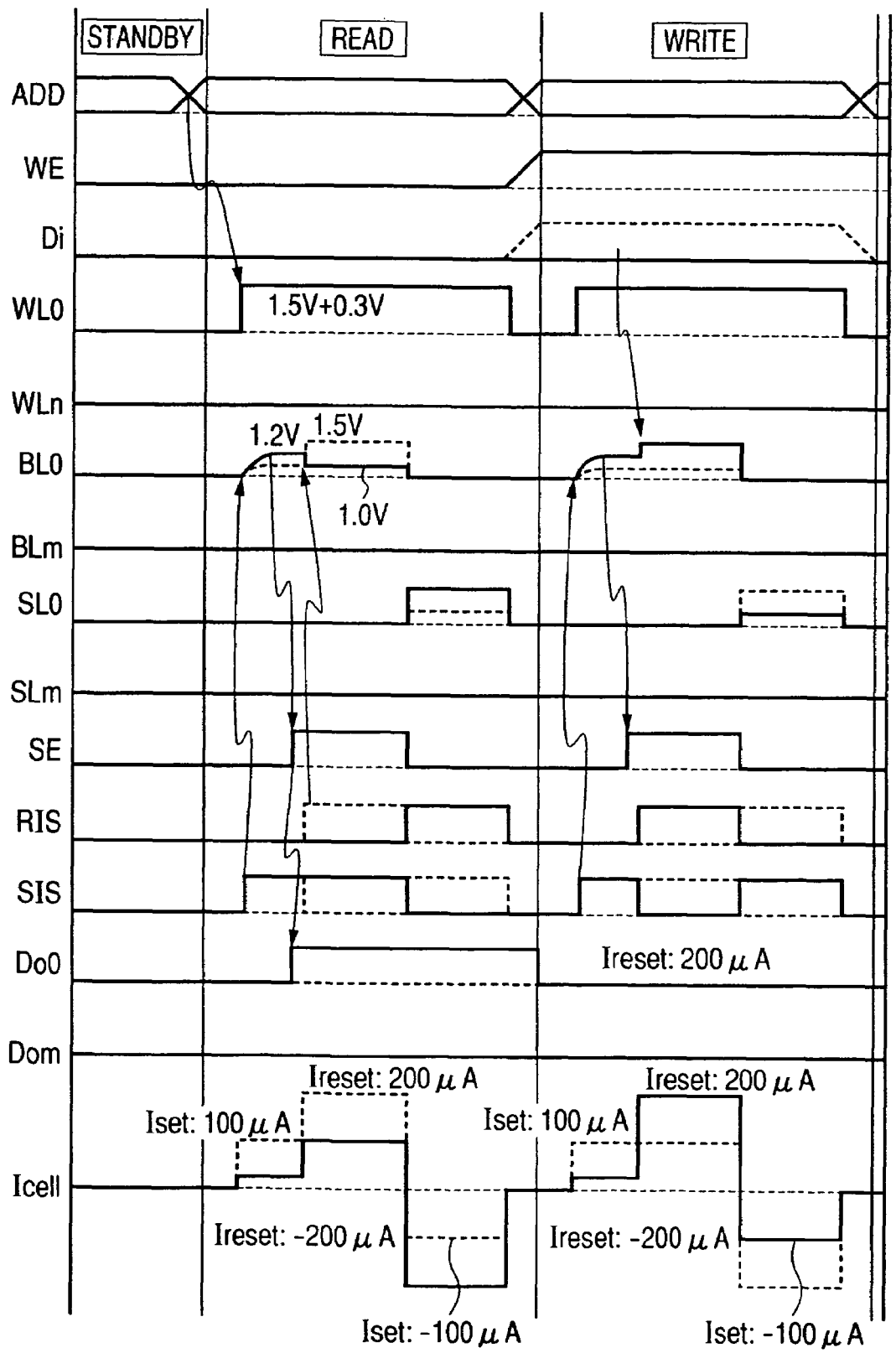
FIG. 23 is operational wave forms of the circuit in FIG. 22

FIG. 23 shows the memory module architecture of the present embodiment, however, only different points from the example 1 are described. The procedure until reading the data by the read operation RESD is the same as that in the first embodiment. After the data read, first, a current pulse is input.

For example if '1' is read, the set current Iset flows through the bit line BL0 by converting the set current select signal SIS from L ' to 'H'. if '0' is read, the reset current Ireset flows through the bit line BL0 by converting the reset current select signal RIS from L ' to 'H'. Then, the read data value is rewritten with the current to the opposite direction. In the case '1' is read, the bit line BL0 is connected to the earth potential, the reset current select signal RIS is from L ' to 'H', thereby the reset current Ireset flows through the source line SL0, and '1' is written. If '0' is read, the bit line BL0 is connected to the earth potential, the reset current select signal RIS is from 'H' to 'L', and the set current select signal SIS is from L' to 'H', thereby the set current Iset flows through the source line SL0, and '0' is written.

After a similar read operation described above, the write operation is executed by applying a current pulse and then a write data (Di value) is written by passing the current to the opposite direction.

As is described above, by applying the current pulse to the opposite direction, the rewrite operation can be executed infinitely, therefore, in a system a read operation is always followed by a write-back operation, there is not any problem expected because of no limit to the rewrite number of times.

For example, since the current always flows from the bit line BL to the source line SL in the write operation, a Te composition ratio in the chalcogenide of phase change element R becomes high around the contact surface with the bit line, and around other contact surface with the transistor Ge and Sb composition ratios are high. In the present example, the direction of current is reversed on the way of write operation. Therefore, if a segregation in the composition is produced, by applying a current pulse to the opposite direction the segregation is resolved and the composition goes back to the original state. As a result, the segregation of the chalcogenide composition arising from ion conductions is prevented, and available number of write is increased, making infinite rewriting possible.

Figure 24:
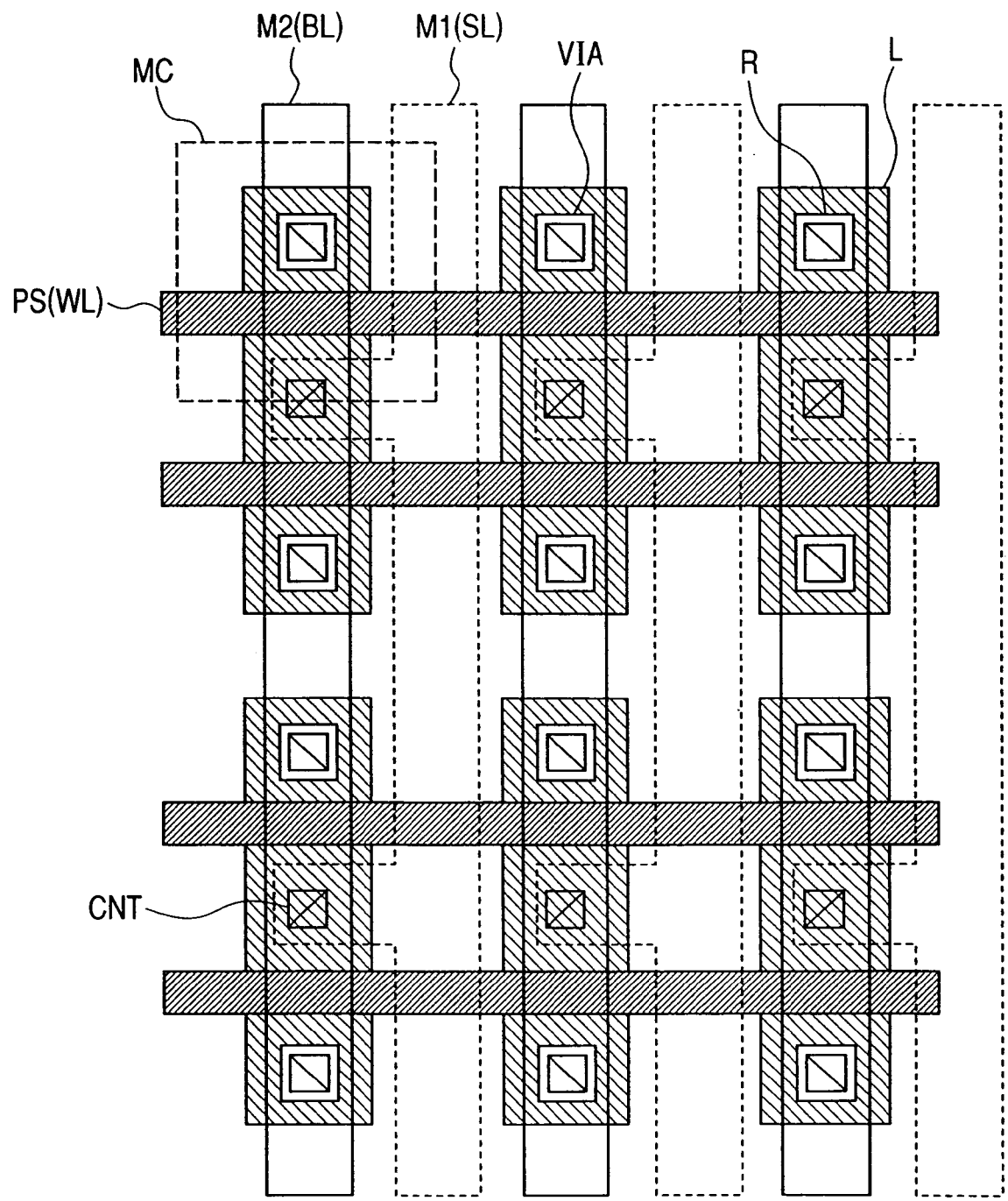
FIG. 24 is a plan view of memory array of sixth embodiment in accordance with the present invention.
Figure 25:
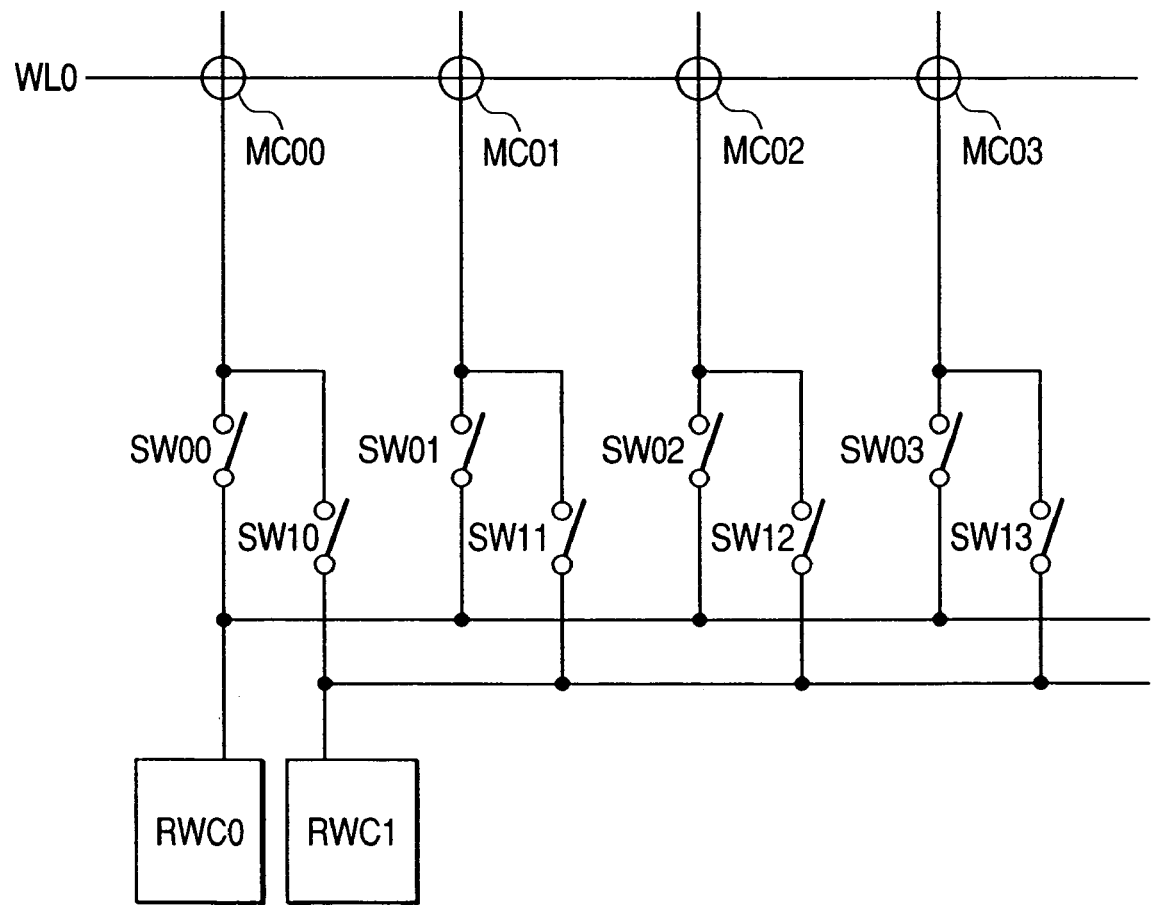
FIG. 25 is a circuit diagram of a multiple port memory array of seventh embodiment in accordance with the present invention.

FIG. 24 shows a plan view of a memory array. A word line WL is formed from a poly silicon layer (PS), a source line SL is from a first wiring layer M1, a bit line BL is from a second wiring layer M2, respectively. The bit line BL and the source line SL are formed in parallel. Additionally, in this example explanation is made in combination with a destructive read operation, however, the present memory device is not always to be used in combination with a destructive read, but the write operation with a positive and a negative pulses results in an important effect to increase possible rewrite number of times.

Seventh Embodiment

FIG. 24 shows an example of a multiple port memory array in accordance with the invention. Each bit line is connected to 2 select switches SW, e.g., BL0 is read by a switch SW00, and connected to a write circuit RWC0, and to RWC1 via SW10. With this construction, a read and a write operations are executed in parallel. In addition, using this system, the data read at a write operation is available for test operations enabling an effective usage of data.

For example, in the case of parallel execution of read and write operations, the read operation is executed with BL0 connected to RWC0 by SW00, at the same time, the write operation is executed with BL1 connected to RWC1 by a switch SW11.

With an appreciable spread of mobile apparatus, a demand for non-volatile memories is also spreading. Especially, those memories are required with characteristics of an easy mixed mounting with a logic circuit, a high speed writing, a capability of a large number of write, and a low driving voltage. A phase change memory the one expected that includes all of those characteristics A stable write operation to a phase change memory is implemented by the present invention that contributes considerably for its practical use. Especially in personal computers with non-volatile memories mixed mounted and IC cards, the memory has a large possibility to be used in extremely wide fields.

What is claimed is:

1. A semiconductor storage device having a plurality of memory cells comprising:
a plurality of word lines;
information storage sections mounted on crossing points of the word lines and a plurality of bit lines with an insulating layer in between; and
select elements,
wherein an operation to write a first information to one of the plurality of memory cells is executed using a first pulse current flowing through one of the plurality of bit lines and a second pulse current flowing in a direction opposite to the first pulse current.

2. The semiconductor storage device according to claim 1, wherein the pulse width of the first pulse current is different from that of the second pulse current.

3. The semiconductor storage device according to claim 1, wherein the amplitude of the first pulse current is different from that of the second pulse current.

4. The semiconductor storage device according to claim 1, wherein the select elements include MIS type transistors.

5. The semiconductor storage device according to claim 1, wherein the select elements include bipolar type transistors.

6. The semiconductor storage device according to claim 1, wherein the select elements include junctions.

7. The semiconductor storage device according to claim 1, wherein the information storage section includes a first electrode layer, a phase change material layer with a resistance that can be varied by heating, and a second electrode layer.

8. The semiconductor storage device according to claim 1, wherein the operation to write a first information to one of the plurality of memory cells is executed by the first pulse current and the second pulse current.

9. The semiconductor storage device according to claim 2, wherein the pulse width of the first pulse current is longer than that of the second pulse current.

10. The semiconductor storage device according to claim 3, wherein the amplitude of the first pulse current is larger than that of the second pulse current.

11. The semiconductor storage device according to claim 7, wherein the phase change material layer includes at least Te.

12. The semiconductor storage device according to claim 7, wherein the phase change material is composed of two or more kinds of atomic elements with difference in electronegativity larger than 0.3.

13. A semiconductor storage device having a plurality of memory cells comprising:
a plurality of word lines;
information storage sections mounted on crossing points of the word lines and a plurality of bit lines with an insulating layer in between; and
a plurality of select elements,
wherein a first pulse current flowing through one of the plurality of bit lines and a second pulse current, which has an amplitude or width different from that of the first pulse current, are provided, said second pulse current flowing in a direction opposite to said first pulse current, and
an operation to write a first information to one of the plurality of memory cells is executed using at least one of a first pulse combination including said first pulse current with said second pulse current following the first pulse current, and a second pulse combination including said second pulse current and said first pulse current following the second pulse current.

14. A semiconductor storage device having a plurality of memory cells comprising:
a plurality of word lines;
information storage sections mounted on crossing points of the word lines and a plurality of bit lines with an insulating layer in between; and
select elements,
wherein an operation to write a first information to one of the plurality of memory cells is executed using a first pulse current having a relatively large amplitude of 50 to 1000 µA flowing through one of the plurality of bit lines and a relatively short pulse width of 5 to 100 ns and a second pulse current having a relatively small amplitude of 20 to 400 µA and a pulse width of 50 to 1000 ns flowing in a direction opposite to the first pulse.

15. The semiconductor storage device according to claim 14, wherein the operation to write a first information to one of the plurality of memory cells is executed by the first pulse current and the second pulse current.

16. A semiconductor storage device having a plurality of memory cells comprising:
a plurality of word lines;
information storage sections mounted on crossing points of the word lines and a plurality of bit lines with an insulating layer in between;
plurality of layers adjacent to the information storage sections; and
select elements,
wherein an operation to write a first information to one of the plurality of memory cells is executed using a first pulse current flowing in a vertical direction to one of the plurality of word lines and a second pulse current flowing in a direction opposite to the first pulse current, and
the composition of each of said plurality of layers adjacent to the information storage sections is silicon or carbon.

17. The semiconductor storage device according to claim 16, wherein the operation to write a first information to one of the plurality of memory cells is executed by the first pulse current and the second pulse current.

18. A semiconductor storage device having a plurality of memory cells comprising:
a plurality of word lines;
information storage sections mounted on crossing points of the word lines and a plurality of bit lines with an insulating layer in between; and
select elements,
wherein an operation to write a first information to one of the plurality of memory cells is executed using a first pulse current flowing through one of the plurality of bit lines, a second pulse current with a smaller current amplitude than that of the first pulse current, and a third pulse current, and
one of the first pulse current, the second pulse current, and the third pulse current flows in a direction opposite to the others of the first pulse current, the second pulse current, and the third pulse current.

19. The semiconductor storage device according to claim 18, wherein the operation to write a first information to one of the plurality of memory cells is executed by the first pulse current, the second pulse current, and the third pulse current.

20. A semiconductor storage device having a plurality of memory cells comprising:
a plurality of word lines;
information storage sections mounted on crossing points of the word lines and a plurality of bit lines with an insulating layer in between; and
select elements,
wherein an operation to write a first information to one of the plurality of memory cells is executed using a first pulse current flowing through one of the plurality of bit lines, and more than one pulse current flowing in a direction opposite to the first pulse current.

21. A personal computer comprising:
a semiconductor storage device having a plurality of memory cells and mix mounted with another semiconductor device, wherein the semiconductor storage device includes:
a plurality of word lines;
information storage sections mounted on crossing points of the word lines and a plurality of bit lines with an insulating layer in between; and
select elements,
wherein an operation to write a first information to one of the plurality of memory cells is executed using a first pulse current flowing through one of the plurality of bit lines, and a second pulse current flowing in a direction opposite to the first pulse current.

22. The personal computer according to claim 21, wherein the operation to write a first information to one of the plurality of memory cells is executed by the first pulse current and the second pulse current.

* * * * *